United States Patent
Lee et al.

(10) Patent No.: US 10,225,495 B2
(45) Date of Patent: Mar. 5, 2019

(54) CROSSTALK PROCESSING MODULE, METHOD OF PROCESSING CROSSTALK AND IMAGE PROCESSING SYSTEM

(71) Applicant: Samsung Electronics Co., Ltd., Suwon-si, Gyeonggi-do (KR)

(72) Inventors: Da-Hee Lee, Suwon-si (KR); Dae-Kwan Kim, Suwon-si (KR); Yo-Hwan Noh, Yongin-si (KR); Kyung-Ho Kim, Suwon-si (KR); Chae-Sung Kim, Seoul (KR); Dong-Ki Min, Seoul (KR); Seong-Won Jo, Suwon-si (KR); Yun-Seok Choi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/823,880

(22) Filed: Nov. 28, 2017

(65) Prior Publication Data

US 2018/0309944 A1    Oct. 25, 2018

(30) Foreign Application Priority Data

Apr. 24, 2017 (KR) .................. 10-2017-0052508

(51) Int. Cl.
*H04N 5/359* (2011.01)
*H01L 27/146* (2006.01)
*G09G 3/3208* (2016.01)

(52) U.S. Cl.
CPC ....... *H04N 5/359* (2013.01); *H01L 27/14609* (2013.01); *G06T 2207/10024* (2013.01); *G09G 3/3208* (2013.01); *H01L 27/14643* (2013.01)

(58) Field of Classification Search
CPC .............. H04N 5/359; H01L 27/14609; H01L 27/14643; G09G 3/3208
See application file for complete search history.

(56) References Cited

U.S. PATENT DOCUMENTS

| | | | |
|---|---|---|---|
| 6,563,509 B1 * | 5/2003 | Harris | ..................... G06T 7/11 345/426 |
| 8,531,558 B2 | 9/2013 | Kikuchi et al. | |
| 8,643,742 B2 | 2/2014 | Proca | |

(Continued)

FOREIGN PATENT DOCUMENTS

JP    2012147334    8/2012

*Primary Examiner* — Abdelaaziz Tissire
(74) *Attorney, Agent, or Firm* — Myers Bigel, P.A.

(57) ABSTRACT

A crosstalk processing module configured to process a crosstalk of an image signal includes a correction element generation unit, a storage, and a crosstalk correction check unit. The correction element generation unit receives the image signal and input information associated with at least a size of the image signal and generates seed values and correction parameters which are used to correct the crosstalk, based on the input information and a representative channel image signal obtained by separating the image signal with respect to color. The storage stores the seed values and the correction parameters. The crosstalk correction check unit receives the image signal, receives the seed values and the correction parameters from the storage, corrects the crosstalk, and outputs a final image signal and pass/fail information indicating a pass or fail of the correction of the crosstalk based on a plurality of reference values.

20 Claims, 18 Drawing Sheets

(56) References Cited

U.S. PATENT DOCUMENTS

| | | |
|---|---|---|
| 8,823,827 B1 | 9/2014 | Li |
| 9,154,750 B2 | 10/2015 | Pang |
| 9,392,237 B2 | 7/2016 | Toyoda |
| 9,479,745 B2 | 10/2016 | Lu et al. |
| 2004/0130546 A1* | 7/2004 | Porikli ............... G06K 9/342 345/423 |
| 2008/0031526 A1* | 2/2008 | Bushell ............... G06K 9/38 382/224 |
| 2009/0180703 A1* | 7/2009 | Jang ............... G06T 5/002 382/254 |
| 2012/0114231 A1* | 5/2012 | Bushell ............... G06T 7/136 382/165 |
| 2012/0201460 A1* | 8/2012 | Seo ............... G06T 7/11 382/180 |
| 2014/0313379 A1 | 10/2014 | Mackey |
| 2016/0086318 A1* | 3/2016 | Hannuksela ............ G06T 5/002 348/43 |
| 2016/0343141 A1* | 11/2016 | Lin ............... G06K 9/627 |

\* cited by examiner

FIG. 8
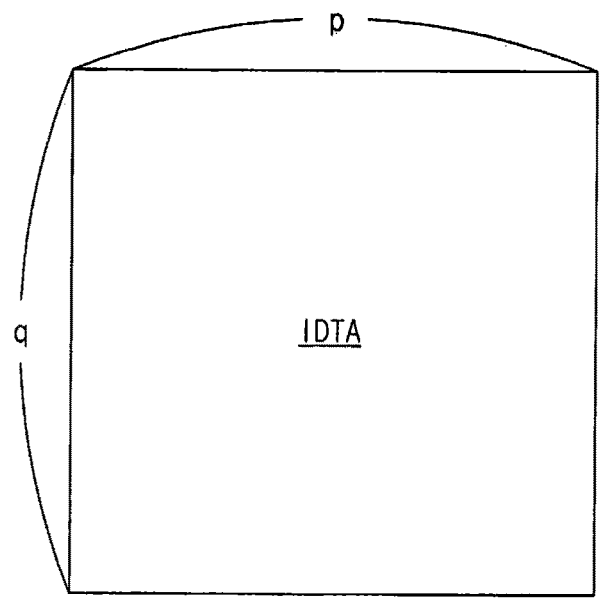
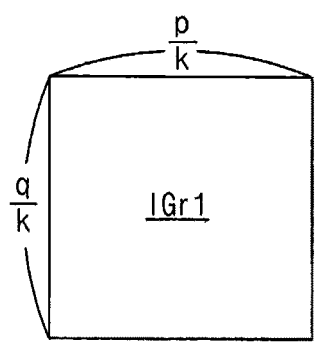
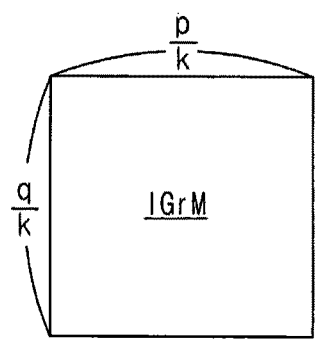
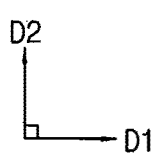

FIG. 10A
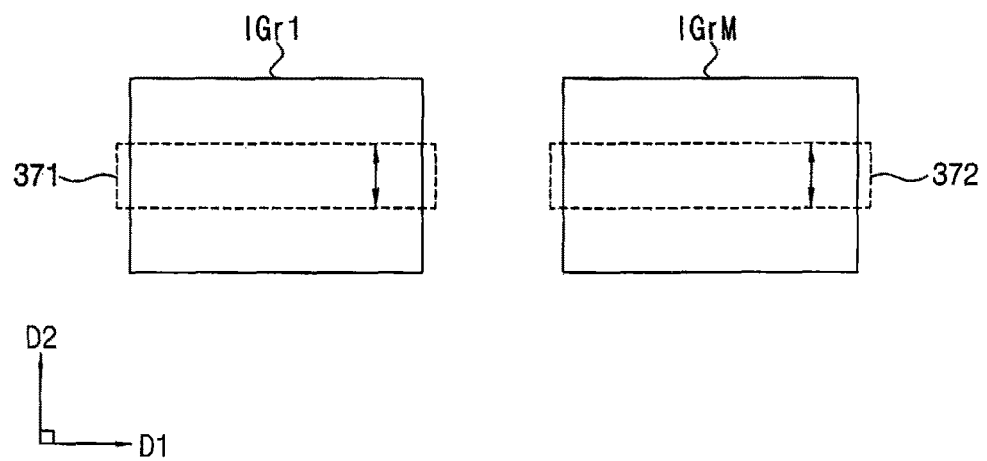
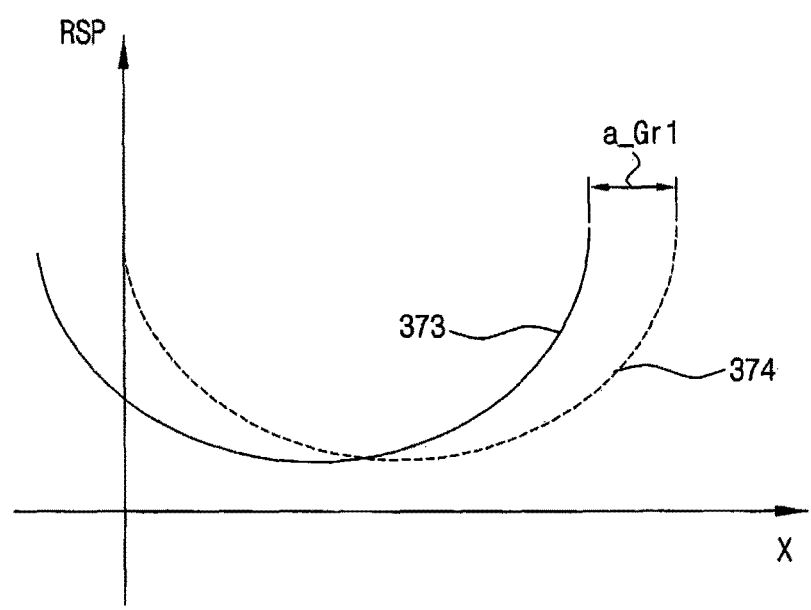

FIG. 10B
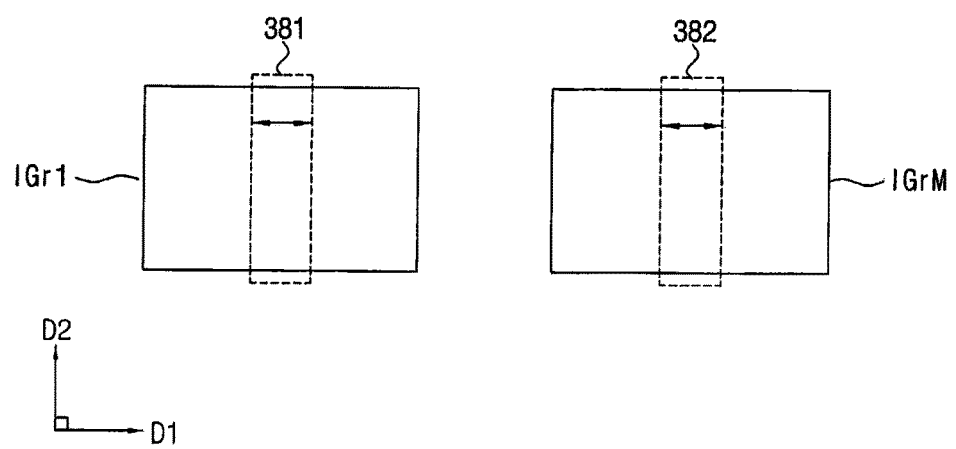
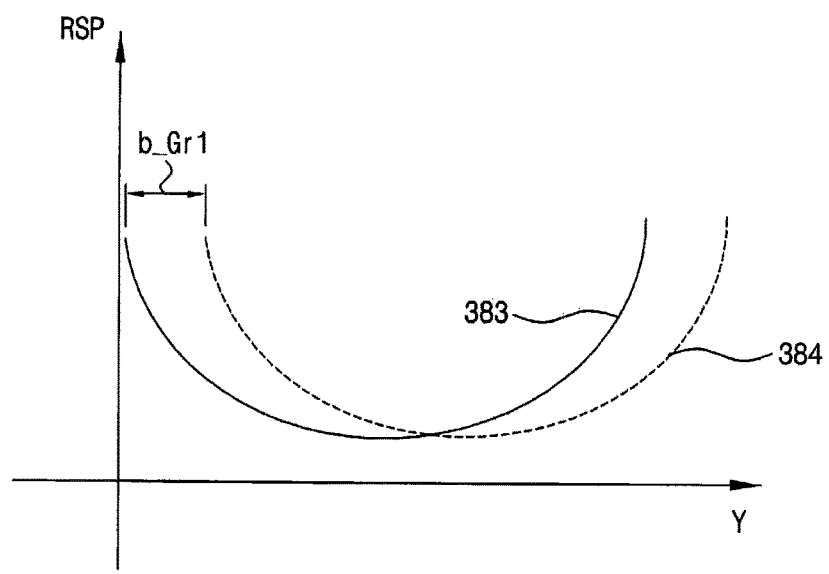

FIG. 15

| CH\DR | GR1 | GR2 | GR3 | GR4 | R1 | R2 | R3 | R4 | B1 | B2 | B3 | B4 | Gb1 | Gb2 | Gb3 | Gb4 |
|---|---|---|---|---|---|---|---|---|---|---|---|---|---|---|---|---|
| 0~1% | w | w | w-1 | w | w-17 | w-2 | w-2 | w-4 | w | w | w | w | w | w | w | w |
| 1~2% | 0 | 0 | 1 | 0 | 17 | 2 | 2 | 4 | 0 | 0 | 0 | 0 | 0 | 0 | 0 | 0 |
| 2~3% | 0 | 0 | 0 | 0 | 0 | 0 | 0 | 0 | 0 | 0 | 0 | 0 | 0 | 0 | 0 | 0 |
| 3~4% | 0 | 0 | 0 | 0 | 0 | 0 | 0 | 0 | 0 | 0 | 0 | 0 | 0 | 0 | 0 | 0 |
| 4~5% | 0 | 0 | 0 | 0 | 0 | 0 | 0 | 0 | 0 | 0 | 0 | 0 | 0 | 0 | 0 | 0 |
| 6~7% | 0 | 0 | 0 | 0 | 0 | 0 | 0 | 0 | 0 | 0 | 0 | 0 | 0 | 0 | 0 | 0 |
| 7~ % | 0 | 0 | 0 | 0 | 0 | 0 | 0 | 0 | 0 | 0 | 0 | 0 | 0 | 0 | 0 | 0 |

CROSSTALK PROCESSING MODULE, METHOD OF PROCESSING CROSSTALK AND IMAGE PROCESSING SYSTEM

CROSS-REFERENCE TO RELATED APPLICATION

This application claims priority under 35 USC § 119 to Korean Patent Application No. 10-2017-0052508, filed on Apr. 24, 2017 in the Korean Intellectual Property Office (KIPO), the content of which is herein incorporated by reference in its entirety.

BACKGROUND

1. Technical Field

Exemplary embodiments relate to image sensors, and more particularly to crosstalk processing modules for processing an image signal from an image sensor, methods of processing crosstalk of the image signal of image processing systems.

2. Description of the Related Art

An image sensor is a semiconductor device that converts a photo image, for example, light reflected by a subject, into an electric signal. Image sensors are widely used in portable electronic devices, such as digital cameras, cellular phones, and the like. Generally, image sensors can be classified into charged coupled device (CCD) image sensors and complementary metal oxide semiconductor (CMOS) image sensors. CMOS image sensors have some advantages over CCD image sensors such as low manufacturing costs, low power consumption, ease of integration with peripheral circuits, and the like. Recently, image sensors employing multi-photodiode devices have been used.

SUMMARY

Some exemplary embodiments provide a crosstalk processing module capable of efficiently processing a crosstalk of an image signal produced from an image sensor having multi-photodiode architecture.

Some exemplary embodiments provide a method of efficiently processing a crosstalk of an image signal produced from an image sensor having multi-photodiode architecture.

Some exemplary embodiments provide an image processing module capable of efficiently processing a crosstalk of an image signal produced from an image sensor having multi-photodiode architecture.

According to some exemplary embodiments, a crosstalk processing module configured to process a crosstalk of an image signal produced from an image sensor is disclosed. The image sensor comprises a pixel array including a plurality of sub-pixels arranged along a plurality of rows and a plurality of columns, and k number of sub-pixels representing one color formed in conjunction with each other. The number may be is an integer equal to or greater than four. The crosstalk processing module may comprise: a correction element generation unit configured to receive the image signal and input information, the input information being associated with at least a size of the image signal, and configured to generate seed values and correction parameters which are used to correct the crosstalk; a storage, connected to the correction element generation unit, configured to store the seed values and the correction parameters; a crosstalk correction check unit configured to receive the image signal, to receive the seed values and the correction parameters from the storage, to correct the crosstalk produced from the image sensor, and to output a final image signal and pass/fail information indicating a pass or fail of the correction of the crosstalk based on a plurality of reference values; and a control engine to control the correction element generation unit, the storage and the crosstalk correction check unit.

According to some exemplary embodiments, in a method of processing a crosstalk of an image signal produced from an image sensor, the image sensor comprises a pixel array including a plurality of sub-pixels arranged along a plurality of rows and a plurality of columns, and k number of sub-pixels representing one color are formed in conjunction with each other, where the number k is an integer equal to or greater than four. The method may comprise: generating seed values and correction parameters which are used to correct the crosstalk based on the image signal, input information associated with at least a size of the image signal, a representative channel image signal obtained by separating the image signal per color and channel image signals obtained by separating the image signal per channel; storing the seed values and the correction parameters in a storage; and correcting the crosstalk of each of the channel image signals based on the image signal, the seed values, and the correction parameter, and determining a pass or fail of the correction of the crosstalk based on a plurality of reference values. The seed values are generated based on the representative channel image signal.

According to some exemplary embodiments, an image processing system includes an image sensor and a crosstalk processing module. The image sensor includes a pixel array that includes a plurality of sub-pixels arranged along a plurality of rows and a plurality of columns, k (k being an integer equal to or greater than four) adjacent sub-pixels of the plurality of sub-pixels represent one color, and the image sensor outputs an image signal. The crosstalk processing module processes a crosstalk of the image signal from the image sensor. The crosstalk processing module includes a correction element generation unit, a storage, a crosstalk correction check unit and a control engine. The correction element generation unit receives the image signal and input information associated with at least a size of the image signal and generates seed values and correction parameters which are used to correct the crosstalk, based on the input information and a representative channel image signal obtained by separating the image signal with respect to color. The storage is connected to the correction element generation unit, and stores the seed values and the correction parameters. The crosstalk correction check unit receives the image signal, receives the seed values and the correction parameters from the storage, corrects the crosstalk, and outputs a final image signal and pass/fail information indicating a pass or fail of the correction of the crosstalk based on a plurality of reference values. The control engine controls the correction element generation unit, the storage and the crosstalk correction check unit.

Accordingly, when processing a crosstalk of the image signal output from an image sensor having multi-photodiodes architecture, an crosstalk processing module separates the image signal into 4*k channel image signals with respect to color filters and generates seed values which are used for correcting the crosstalk of each of the 4*k channel image signals based on k representative channel image signals. Therefore, the crosstalk processing module may reduce storing space of a storage to store the seed values and a number of accesses to the storage.

BRIEF DESCRIPTION OF THE DRAWINGS

Illustrative, non-limiting example embodiments will be more clearly understood from the following detailed description taken in conjunction with the accompanying drawings.

FIG. 8 illustrates sizes of various image signals input to or output from the correction parameter generation unit of FIG. 7.

FIGS. 10A and 10B are diagrams for explaining shifts in first and second direction, between a first green channel image signal IGr1 and a first green representative channel image signal IGrM.

FIG. 15 illustrates a histogram output from the pass/fail checker.

DETAILED DESCRIPTION

Various example embodiments will be described more fully with reference to the accompanying drawings, in which embodiments are shown.

Figure 1:
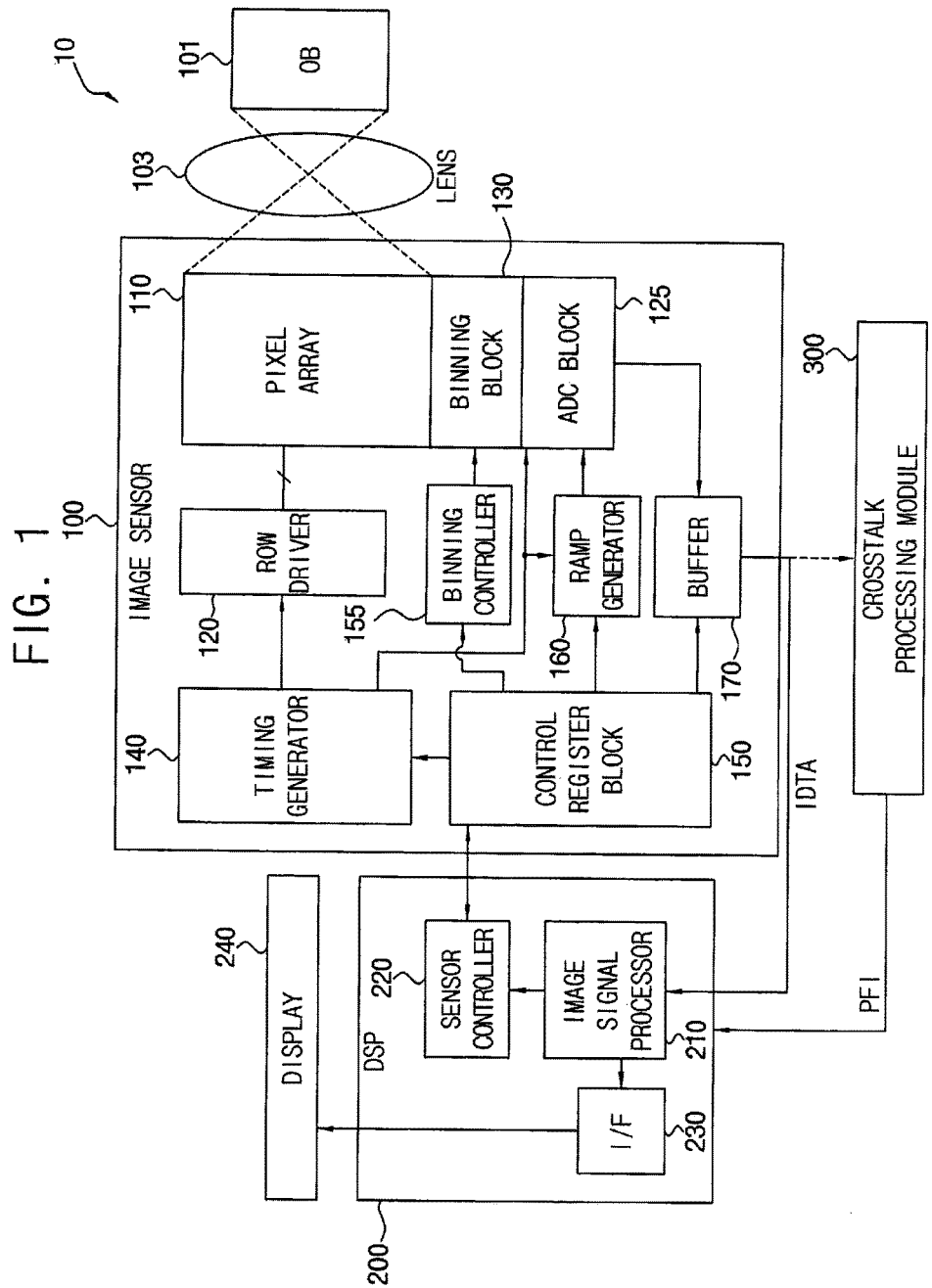
FIG. 1 is a block diagram illustrating an image processing system according to exemplary embodiments.

FIG. 1 is a block diagram illustrating an image processing system according to exemplary embodiments.

Referring to FIG. 1, an image processing system 10 may be implemented as a portable electronic device such as, including but not limited to, a laptop computer, a cellular phone, a smart phone, a tablet personal computer (PC), a personal digital assistant (PDA), an enterprise digital assistant (EDA), a digital still camera, a digital video camera, a portable multimedia player (PMP), a mobile internet device (MID), a wearable computer, an internet of things (IoT) device, an internet of everything (IoE) device, or the like.

The image processing system 10 may include an optical lens 103, a complementary metal-oxide-semiconductor (CMOS) image sensor (or, an image sensor) 100, a digital signal processor (DSP) 200, and a display 240. The image processing system 10 may further include a crosstalk processing module 300.

The image sensor 100 may generate image data IDTA corresponding to an object 101 input through the optical lens 103. The image data IDTA may correspond to pixel signals output from a plurality of photoelectric conversion elements. A photoelectric conversion element may be implemented as a photodiode, a phototransistor, a photogate, or a pinned-photodiode.

The image sensor 100 may include a pixel array 110, a row driver 120, an analog-to-digital converter (ADC) block 125, a binning block 130, a timing generator 140, a control register block 150, a binning controller 155, a ramp generator 160, and a buffer 170.

The pixel array 110 may include a plurality of sub-pixels arranged in two dimensions. The sub-pixels of the image sensor 100 may be manufactured using CMOS manufacturing processes. Each of the sub-pixels may include a plurality of photoelectric conversion elements. In exemplary embodiments, one color pixel may be represented by k number of sub-pixels which may be formed in conjunction with each other, where the k is an integer equal to or greater than four.

Each of the sub-pixels included in the pixel array 110 may include a photodiode. The photodiode is an example of a photoelectric conversion element and may be replaced with a phototransistor, a photogate, or a pinned-photodiode. The sub-pixels may be arranged in a matrix in the pixel array 110. Each of the sub-pixels may transmit a pixel signal to a column line.

The row driver 120 may drive control signals for controlling the operation of the sub-pixels to the pixel array 110 according to the control of the timing generator 140. The row driver 120 may function as a control signal generator which generates the control signals.

The timing generator 140 may control the operations of the row driver 120, the ADC block 125, and the ramp generator 160 according to the control of the control register block 150. The timing generator 140 may control the operation of the ADC block 125 and determine activating or deactivating ADCs included in the ADC block 125 according to the control of the control register block 150.

The binning block 130 may bin a pixel signal output from each of the sub-pixels included in the pixel array 110 and may output a binned pixel signal.

The ADC block 125 may include an ADC and memory for each column. The ADC may perform correlated double sampling (CDS). The ADC block 125 may include a plurality of ADCs. Each of the ADCs may be shared by photoelectric conversion elements in each pixel. The ADC block 125 may generate a digital image signal corresponding to the binned pixel signal output from the binning block 130.

The control register block 150 may control the operations of the timing generator 140, the binning controller 155, the ramp generator 160, and the buffer 170 according to the control of the DSP 200. The binning controller 155 may control the binning block 130 according to the control of the control register block 150.

The buffer 170 may transmit the image data IDTA corresponding to digital image signals output from the ADC block 125 to the DSP 200. The DSP 200 may include an image signal processor (ISP) 210, a sensor controller 220, and an interface (I/F) 230.

The ISP 210 may control the OF 230 and the sensor controller 220 which controls the control register block 150. The CMOS image sensor 100 and the DSP 200 may be implemented in a single package, e.g., a multi-chip package (MCP).

Although the image sensor 100 and the ISP 210 are separated from each other in FIG. 1, the ISP 210 may be implemented as a part of the image sensor 100 in exemplary embodiments.

The ISP 210 may process the image data IDTA received from the buffer 170 and may transmit processed image data to the I/F 230. In detail, the ISP 210 may interpolate the image data IDTA corresponding to pixel signals output from the sub-pixels to generate interpolated image data.

The sensor controller 220 may generate various control signals for controlling the control register block 150 according to the control of the ISP 210. The I/F 230 may transmit the processed image data, e.g., the interpolated image data from the ISP 210 to the display 240.

The display 240 may display the interpolated image data output from the I/F 230. The display 240 may be, but is not limited to, a thin film transistor-liquid crystal display (TFT-LCD), a light emitting diode (LED) display, an organic LED (OLED) display, an active-matrix OLED (AMOLED) display, or a flexible display.

The crosstalk processing module 300 may correct a crosstalk of the image signal IDTA produced from the image sensor 100, may determine pass or fail of the correction of the crosstalk and may transmit, to the DSP 200, pass/fail information PFI indicating the pass or fail of the correction of the crosstalk. The crosstalk processing module 300 may separate the image signal IDTA with regard to sub-pixels to generate a plurality of channel image signals, may average pixel values of each of the channel image signals with regard to a color to generate representative image signals, and may generate seed values and correction parameters which are used for correcting crosstalk of each of the channel image signals based on the representative image signals.

The crosstalk processing module 300 may correct the crosstalk of each of the channel image signals based on the representative image signals using the seed values and the correction parameters and may determine the pass/fail of the correction of the crosstalk.

Although the image sensor 100 and the crosstalk processing module 300 are separated from each other in FIG. 1, the crosstalk processing module 300 may be implemented as a part of the image sensor 100 in exemplary embodiments.

Figure 2:
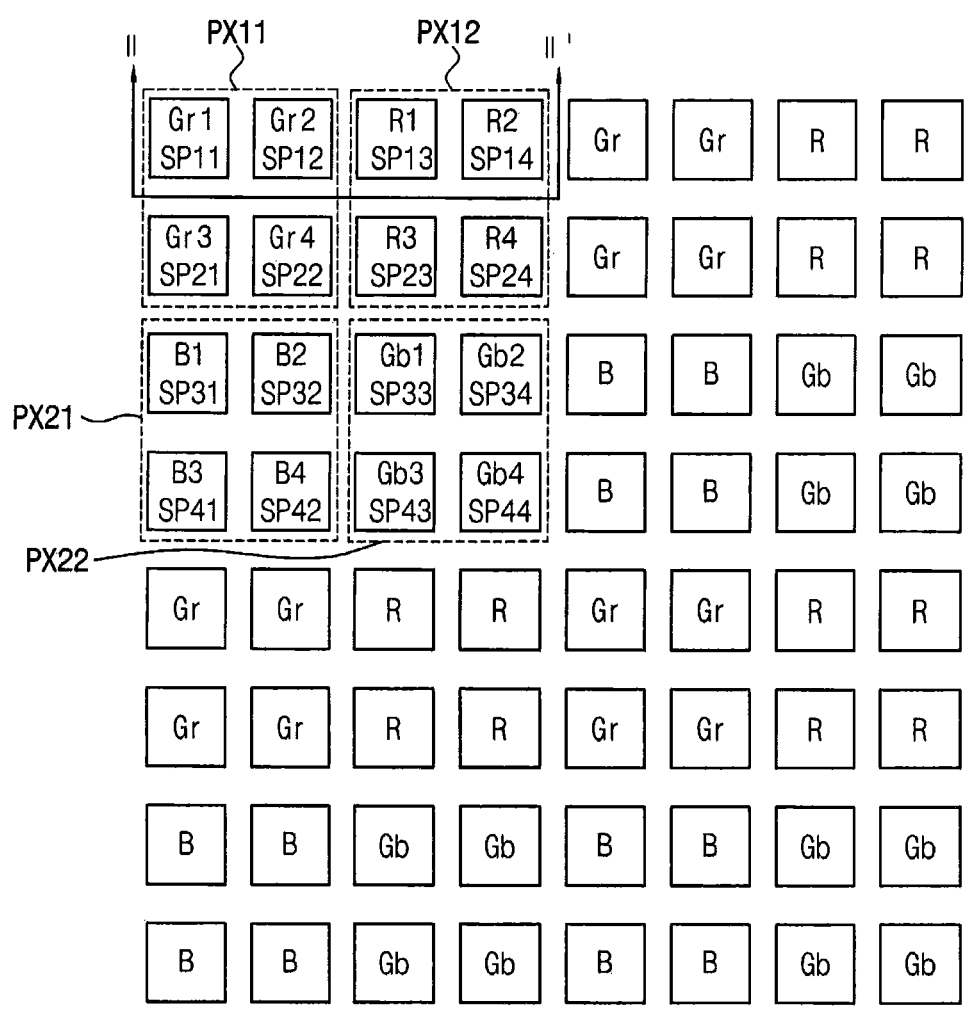
FIG. 2 is a block diagram illustrating the pixel array in the image processing system of FIG. 1 according to exemplary embodiments.

FIG. 2 is a block diagram illustrating the pixel array in the image processing system of FIG. 1 according to exemplary embodiments.

The pixel array illustrated in FIG. 2 may include a color filter array of the pixel array.

A pixel array may have an 8*8 (herein, * denotes a multiplication) matrix structure. Furthermore, it is assumed that one pixel PIX includes four sub-pixels SP adjacently arranged. However, the present disclosure is not limited thereto, and the arrangement of the pixel array 110 and a color filter array may be variously changed or modified without departing from the scope of the inventive concept.

Referring to FIG. 2, the pixel array 110 may include a plurality of pixels PIX11~PIX22. As illustrated in FIG. 2, the plurality of pixels PIX11 to PIX22 may include a plurality of sub-pixels SP11~SP44.

For example, the pixel PX11 may include sub-pixels SP11, SP12, SP21, and SP22. Each of the sub-pixels SP11, SP12, SP21, and SP22 may include a first color filter (for example, a first green (Gr) color filter). That is, the sub-pixels SP11, SP12, SP21, and SP22 may convert green light into an electrical signal.

The pixel PIX12 may include sub-pixels SP13, SP14, SP23, and SP24. Each of the sub-pixels SP13, SP14, SP23, and SP24 may include a second color filter (for example, a red (R) color filter). That is, the sub-pixels SP13, SP14, SP23, and SP24 may convert red light into an electrical signal.

The pixel PIX21 may include sub-pixels SP31, SP32, SP41, and SP42. Each of the sub-pixels SP31, SP32, SP41, and SP42 may include a third color filter (for example, a blue (B) color filter). That is, the sub-pixels SP31, SP32, SP41, and SP42 may convert red light into an electrical signal.

The pixel PIX22 may include sub-pixels SP33, SP34, SP43, and SP44. Each of the sub-pixels SP33, SP34, SP43, and SP44 may include a fourth color filter (for example, a second a green (Gb) color filter). That is, the sub-pixels SP33, SP34, SP43, and SP44 may convert green light into an electrical signal.

One pixel PX may include four sub-pixels which are adjacently arranged, and four sub-pixels included in one pixel may include the same color filter.

In exemplary embodiments, the four pixels PX11, PX12, PX21, and PX22 may constitute a Bayer pattern. The Bayer pattern is described with reference to FIG. 2. However, the present disclosure is not limited thereto. For example, the pixel array 110 may include various color filter array patterns such as an RGBE pattern, a CYGM pattern, a CYYM pattern, and the like.

Figure 3:
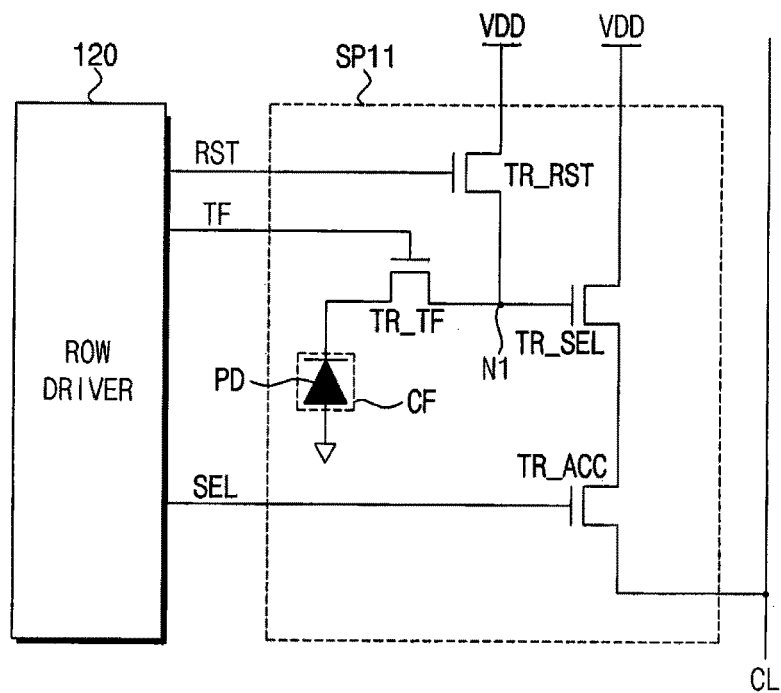
FIG. 3 is a diagram for describing one sub-pixel illustrated in FIG. 2 according to exemplary embodiments.

FIG. 3 is a diagram for describing one sub-pixel illustrated in FIG. 2 according to exemplary embodiments.

An embodiment of the inventive concept is exemplified in FIG. 3 as a sub-pixel has a 4TR structure. However, the present disclosure is not limited thereto. A sub-pixel may be changed or modified to have a 1TR structure, a 3TR structure, or any other pixel structure.

Referring to FIGS. 2 and 3, the sub-pixel SP11 may be connected to the row driver 120 through a reset line RST, a transfer line TF, and a selection line SEL. The sub-pixel SP11 may include a photodiode PD, a transfer transistor TR_TF, a reset transistor TR_RST, a selection transistor TR_SEL, and an access transistor TR_ACC.

One end of the transfer transistor TR_TF may be connected to a cathode of the photodiode PD, the other end thereof may be connected to a first node N1, and a control electrode thereof may be connected to the transfer line TF. One end of the reset transistor TR_RST may be connected to receive a power supply voltage VDD, the other end thereof may be connected to the first node N1, and a control electrode thereof may be connected to the reset line RST.

One end of the selection transistor TR_SEL may be connected to receive the power supply voltage VDD, the other end thereof may be connected to one end of the access transistor TR_ACC, and a control electrode thereof may be connected to the first node N1. The other end of the access transistor TR_ACC may be connected to a column line CL, and a control electrode thereof may be connected to the selection line SEL.

The photodiode PD may generate charges in response to light passing through a color filter CF. The color filter CF may be configured such that light of a predetermined color is transmitted. In exemplary embodiments, as described with reference to FIG. 2, the color filter CF of the sub-pixel SP11 may be a first green (Gr) color filter. In this case, light which passes through the color filter CF may be green light, and the photodiode PD may generate charges in response to the green light.

The transfer transistor TR_TF may provide the first node N1 with charges, which are generated by the photodiode PD, in response to a control signal on the transfer line TF. The reset transistor TR_RST may reset a potential of the node N1 to the power supply voltage VDD in response to a signal on the reset line RST.

The selection transistor TR_SEL may provide the power supply voltage VDD to a drain of the access transistor TR_ACC in response to a voltage on the first node N1. As the selection transistor TR_SEL operates, a drain voltage of the access transistor TR_ACC may vary in proportion to a voltage on the first node N1.

That is, a variation in a drain voltage of the access transistor TR_ACC may correspond to a variation in the amount of charges generated by the photodiode PD. In other words, the variation in the drain voltage may be a value corresponding to data captured by the photodiode PD. The access transistor TR_ACC may provide the column line CL with data (i.e., a changed voltage) in response to a signal on the selection line SEL.

Figure 4:
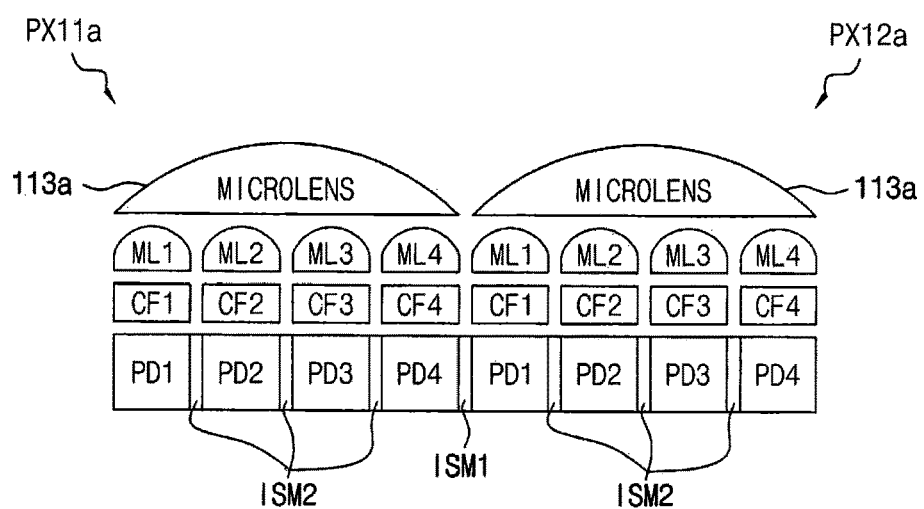
FIGS. 4 and 5 are cross-sectional views of pixels taken along the line II-II' illustrated in the pixel array of FIG. 2, according to exemplary embodiments.
Figure 5:
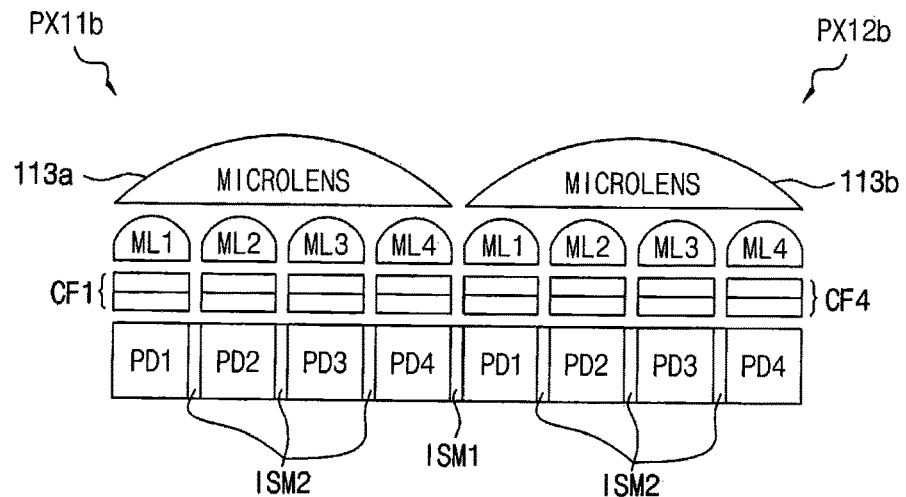

FIGS. 4 and 5 are cross-sectional views of pixels taken along the line II-II' illustrated in the pixel array of FIG. 2, according to exemplary embodiments.

Referring to FIGS. 2 and 4, a first pixel PX11a may include four photodiodes PD1 through PD4, color filters CF1 through CF4 respectively placed on the four photodiodes PD1 through PD4, microlenses ML1 through ML4 respectively placed on the color filters CF1 through CF4, and the microlens 113a placed on the microlenses ML1 through ML4. The color filters CF1 through CF4 may be green color filters.

A second pixel PX12a may include four photodiodes PD1 through PD4, the color filters CF1 through CF4 respectively placed on the four photodiodes PD1 through PD4, the microlenses ML1 through ML4 respectively placed on the color filters CF1 through CF4, and the microlens 113b placed on the microlenses ML1 through ML4. The color filters CF1 through CF4 may be red color filters.

A first isolation material ISM1 may be placed between the first pixel PX11a and the second pixel PX12a. A second isolation material ISM2 may be placed among the four photodiodes PD1 through PD4 in each pixel PX11a or PX12a. The first and second isolation materials ISM1 and ISM2 may be formed using deep trench isolation (DTI).

Referring to FIGS. 2 and 5, a first pixel PX11b may include four photodiodes PD1 through PD4, the color filters CF1 through CF4 respectively placed on the four photodiodes PD1 through PD4, the microlenses ML1 through ML4 respectively placed on the color filters CF1 through CF4, and the microlens 113a placed on the microlenses ML1 through ML4. The color filters CF1 through CF4 may include a plurality of color filter layers.

A second pixel PX12b may include four photodiodes PD1 through PD4, the color filters CF1 through CF4 respectively placed on the four photodiodes PD1 through PD4, the microlenses ML1 through ML4 respectively placed on the color filters CF1 through CF4, and the microlens 113b placed on the microlenses ML1 through ML4. The color filters CF1 through CF4 may include a plurality of color filter layers. A first isolation material ISM1 may be placed between the first pixel PX11b and the second pixel PX12b. A second isolation material ISM2 may be placed among the four photodiodes PD1 through PD4 in each pixel PX11b or PX12b.

Figure 6:
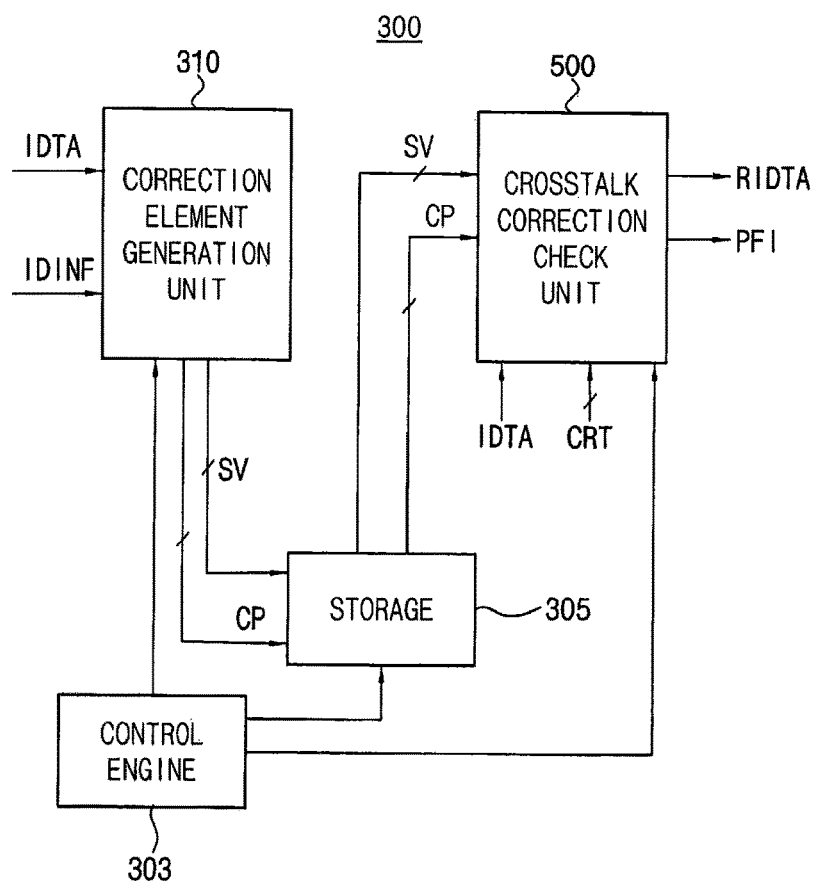
FIG. 6 is a block diagram illustrating a crosstalk processing module in FIG. 1 according to exemplary embodiments.

FIG. 6 is a block diagram illustrating a crosstalk processing module in FIG. 1 according to exemplary embodiments.

Referring to FIG. 6, the crosstalk processing module 300 may include a control engine 303, a storage 305, a correction parameter generation unit 310 and a crosstalk correction check unit 500.

The correction parameter generation unit 310 may receive the image signal IDTA and input information IDINF which is associated with at least a size of the image signal IDTA and may generate seed values SV and correction parameters CP which are used to correct the crosstalk, based on the input information IDINF a representative channel image signal. The representative channel image signal may be obtained by separating the image signal IDTA with respect to color. The input information IDINF may include size information of the image signal IDTA and a pedestal of the image signal IDTA.

The storage 305 may be connected to the correction element generation unit 310 and may store the seed values SV and the correction parameters CR The storage 305 may be implemented with a nonvolatile memory such as NAND flash or a resistive type memory or may be implemented with a volatile memory such as dynamic random access memory (DRAM) or a static random access memory (SRAM).

The crosstalk correction check unit 50Q may receive the image signal IDTA, may receive the seed values SV and the correction parameters CP from the storage 305, may correct the crosstalk and may output a final image signal RFI and pass/fail information PFI indicating a pass or fail of the correction of the crosstalk based on a plurality of reference values CRT.

The control engine 303 may control the correction parameter generation unit 310, the crosstalk correction check unit 500 and the storage 305.

Each of the correction parameter generation unit 310 and the crosstalk correction check unit 500 may be implemented with hardware or software. When each of the correction parameter generation unit 310 and the crosstalk correction check unit 500 is implemented with software, the correction parameter generation unit 310 and the crosstalk correction check unit 500 may be stored in the storage 305. The correction parameter generation unit 310 and the crosstalk correction check unit 500 stored in the storage 305 may be driven by the control engine 303

The correction parameter generation unit 310 generates the seed values SV and the correction parameters CP based on the representative channel image signal and stores the seed values SV and the correction parameters CP in the storage 305. Therefore, the crosstalk processing module 300 may require less storing space of the storage 305 and a number of accesses to the storage 305 may be reduced.

Figure 7:
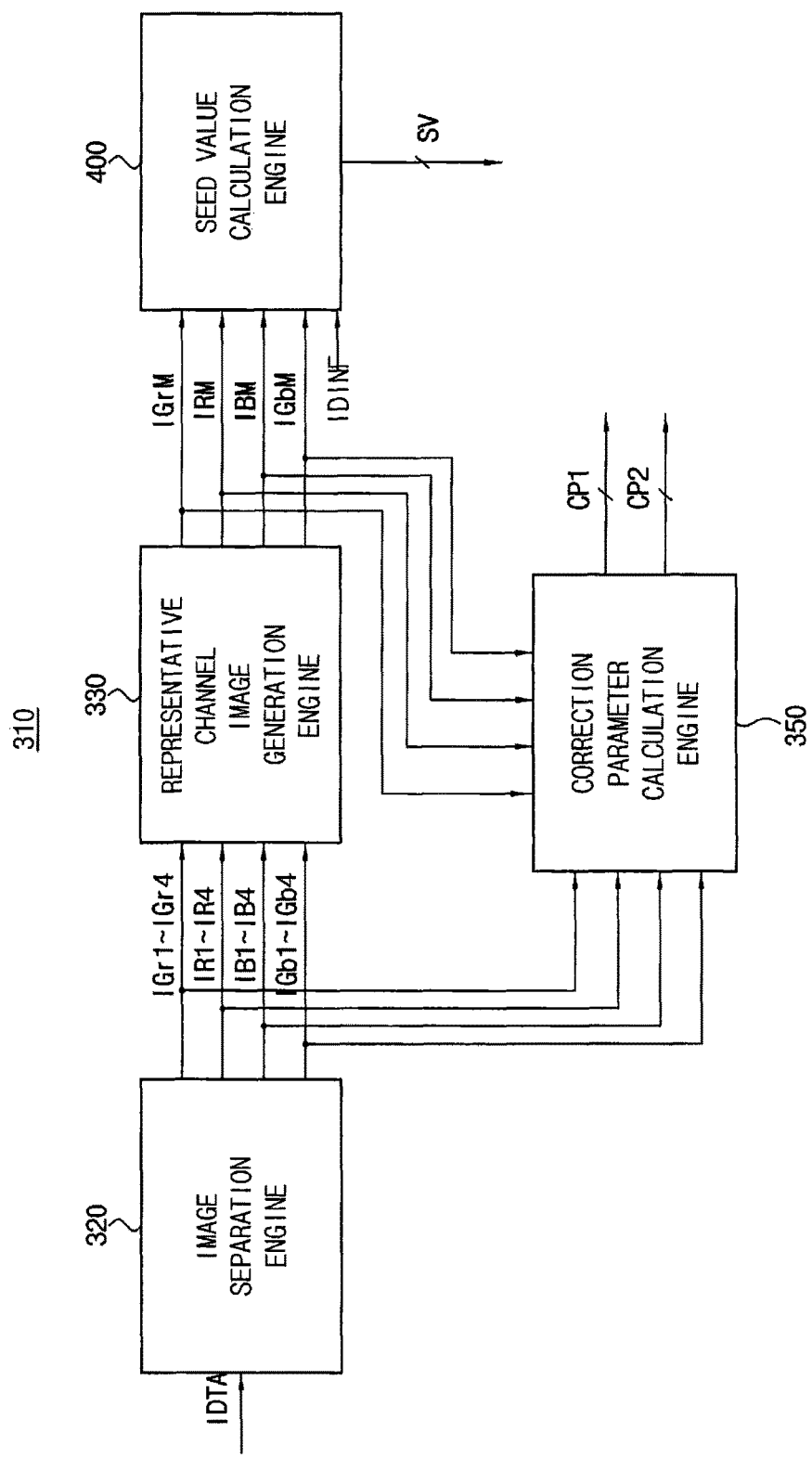
FIG. 7 is a block diagram illustrating the correction parameter generation unit in the crosstalk processing module of FIG. 6 according to exemplary embodiments.

FIG. 7 is a block diagram illustrating the correction parameter generation unit in the crosstalk processing module of FIG. 6 according to exemplary embodiments.

Referring to FIG. 7, the correction parameter generation unit 310 may include an image separation engine 320, a representative channel image generation engine 330, a correction parameter calculation engine 350 and a seed value calculation engine 400.

The image separation engine 320 may separate the image signal IDTA according to a channel of sub-pixels corresponding to each of the color filters in FIG. 2 and may generate 4*k (k is an integer equal to or greater than four) channel image signals IGr1~IGr4, IR1~IR4, IB1~IB4 and IGb1~IGb4.

The representative channel image generation engine 330 may average pixel values with respect to each of the color filters, of each of the 4*k channel image signals IGr1~IGr4, IR1~IR4, IB1~IB4 and IGb1~IGb4 and may generate k representative channel image signals IGrM, IRM, IBM and IGbM. The representative channel image generation engine 330 may generate the k representative channel image signals IGrM, IRM, IBM and IGbM by averaging corresponding pixel values which are 4*k number of channel image signals IGr1~IGr4, IR1~IR4, IB1~IB4 and IGb1~IGb4. The 4*k number of channel image signals may correspond to each of the color filters or selecting mean value of the corresponding pixel values. That is, the representative channel image generation engine 330 may calculate a representative value of pixel values of each of the 4*k channel image signals IGr1~IGr4, IR1~IR4, IB1~IB4 and IGb1~IGb4.

The correction parameter calculation engine 350 may calculate correction parameters CP1 and CP2 based on the 4*k channel image signals IGr1~IGr4, IR1~IR4, IB1~IB4 and IGb1~IGb4 and the k representative channel image signals IGrM, IRM, IBM and IGbM.

The seed value calculation engine 400 may generate the seed values SV based on the k representative channel image signals IGrM, IRM, IBM and IGbM and the input information IDINF. From a description associated with FIG. 4, the number k may correspond to four.

FIG. 8 illustrates sizes of various image signals input to or output from the correction parameter generation unit of FIG. 7.

Referring to FIG. 8, the image signal IDTA may have a first size defined by p (where p is a multiple of four and is greater than four) sub-pixels along a first direction D1 and q (where q is a multiple of four and is greater than four) sub-pixels along a second direction D2 perpendicular to the first direction D1.

Each of the 4*k channel image signals IGr1~IGr4, IR1~IR4, IB1~IB4 and IGb1~IGb4 may have a second size defined by p/k sub-pixels along the first direction D1 and q/k sub-pixels along the second direction D2. In addition, each of the k representative channel image signals IGrM, IRM, IBM and IGbM have a second size defined by p/k sub-pixels along the first direction D1 and q/k sub-pixels along the second direction D2.

Figure 9:
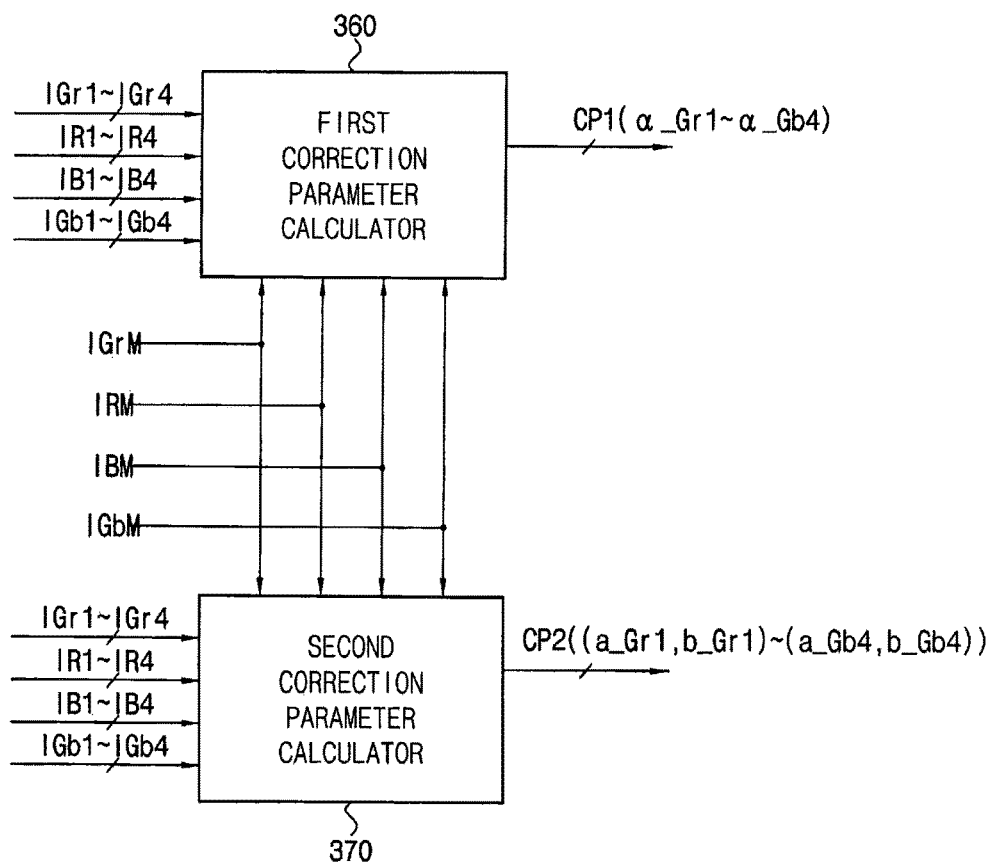
FIG. 9 is a block diagram illustrating the correction parameter calculation engine in the correction parameter generation unit of FIG. 7 according to exemplary embodiments.

FIG. 9 is a block diagram illustrating the correction parameter calculation engine in the correction parameter generation unit of FIG. 7 according to exemplary embodiments.

Referring to FIG. 9, the correction parameter calculation engine 350 may include a first correction parameter calculator 360 and a second correction parameter calculator 370.

The first correction parameter calculator 360 may calculate a ratio of a sum of pixel values of each of the k representative channel image signals IGrM, IRM, IBM and IGbM to a sum of pixel values of each of the 4*k channel image signals IGr1~IGr4, IR1~IR4, IB1~IB4 and IGb1~IGb4 with respect to each channel to calculate 4*k of first correction parameters CP1 ($\alpha\_Gr1$~$\alpha\_Gb4$), based on the k representative channel image signals IGrM, IRM, IBM and IGbM and the 4*k channel image signals IGr1~IGr4, IR1~IR4, IB1~IB4 and IGb1~IGb4.

The second correction parameter calculator 470 calculate 4*k pairs of second correction parameters CP2 ((a_Gr1, b_Gr1) (a_Gb4, b_Gb4)), each pair including a first shift along a first direction and a second shift along a second direction perpendicular to the first direction based on the k representative channel image signals IGrM, IRM, IBM and IGbM and the 4*k channel image signals IGr1~IGr4, IR1~IR4, IB1~IB4 and IGb1~IGb4. The first shift may be associated with a shift between each of the k representative channel image signals IGrM, IRM, IBM and IGbM and each of k image signals of a same color channel in the first direction, the second shift may be associated with a shift between each of the k representative channel image signals IGrM, IRM, IBM and IGbM and each of the k image signals of the same color channel in the second direction, and the k image signals of the same color channel may be associated with image signals corresponding to the same color filter.

FIGS. 10A and 10B are diagrams for explaining shifts in first and second direction, between a first green channel image signal IGr1 and a first green representative channel image signal IGrM.

Referring to FIG. 10A, for calculating a first shift in a first direction D1 between the first green channel image signal IGr1 and the first green representative channel image signal IGrM, average values of a first number of rows of pixel values located in each of a center portion 371 in a second direction D2 in the first green channel image signal IGr1 and a center portion 372 in the second direction D2 in the first green representative channel image signal IGrM are calculated with respect to a column as reference numerals 373 and 374 indicate, a sum of absolute difference (SAD) of each of average values of first green channel image signal IGr1 and the first green representative channel image signal IGrM is calculated, and the first shift a_Gr1 in the first direction D1 between the first green channel image signal IGr1 and the first green representative channel image signal IGrM may be calculated. In FIG. 10A, X axis may correspond to the first direction D1 and RSP means a response of each of the first green channel image signal IGr1 and the first green representative channel image signal IGrM.

Referring to FIG. 10B, for calculating a second shift in the second direction D2 between the first green channel image signal IGr1 and the first green representative channel image signal IGrM, average values of a second number of columns of pixel values located in each of a center portion 381 in the first direction D1 in the first green channel image signal IGr1 and a center portion 383 in the first direction D1 in the first green representative channel image signal IGrM are calculated with respect to a row as reference numerals 383 and 384 indicate, the SAD of each of average values of the first green channel image signal IGr1 and the first green representative channel image signal IGrM is calculated, and the second shift b_Gr1 in the second direction D2 between the first green channel image signal IGr1 and the first green representative channel image signal IGrM may be calculated. In FIG. 10B, Y axis may correspond to the second direction D2. The first number may be the same as the second number.

In exemplary embodiments, the first shift a_GR1 in the first direction D1 and the second shift b_Gr1 in the second direction D2 may be calculated based on all of the pixel values of each of the first green channel image signal IGr1 and the first green representative channel image signal IGrM instead of a portion of the pixel values.

The second correction parameters (a_Gr2, b_Gr2) (a_Gb4, b_Gb4) may be calculated similarly with description with reference to FIGS. 10A and 10B.

For example, a first shift a_Gr2 in the first direction and a second shift b_Gr2 between a second green channel image signal IGr2 and the first green representative channel image signal IGrM may be similarly calculated. When calculating the first shift a_Gr in the first direction and the second shift b_Gr of the channel image signals IGr1~IGr4, the first green representative channel image signal IGrM is commonly used, which is applicable to the channel image signals IR1~IR4, IB1~IB4 and IGB1~IGb4. Therefore, the crosstalk processing module 300 may reduce storing space of the storage 305 and a number of accesses to the storage 305.

In exemplary embodiments, the first shift a_Gr2 in the first direction and the second shift b_Gr2 of the channel image signals IGr1~IGr4 may be calculated, using Sum of Absolute Transformed Difference (SATD), Sum of Squared Difference (SSD) or Mean of Absolute Difference (MAD).

Figure 11:
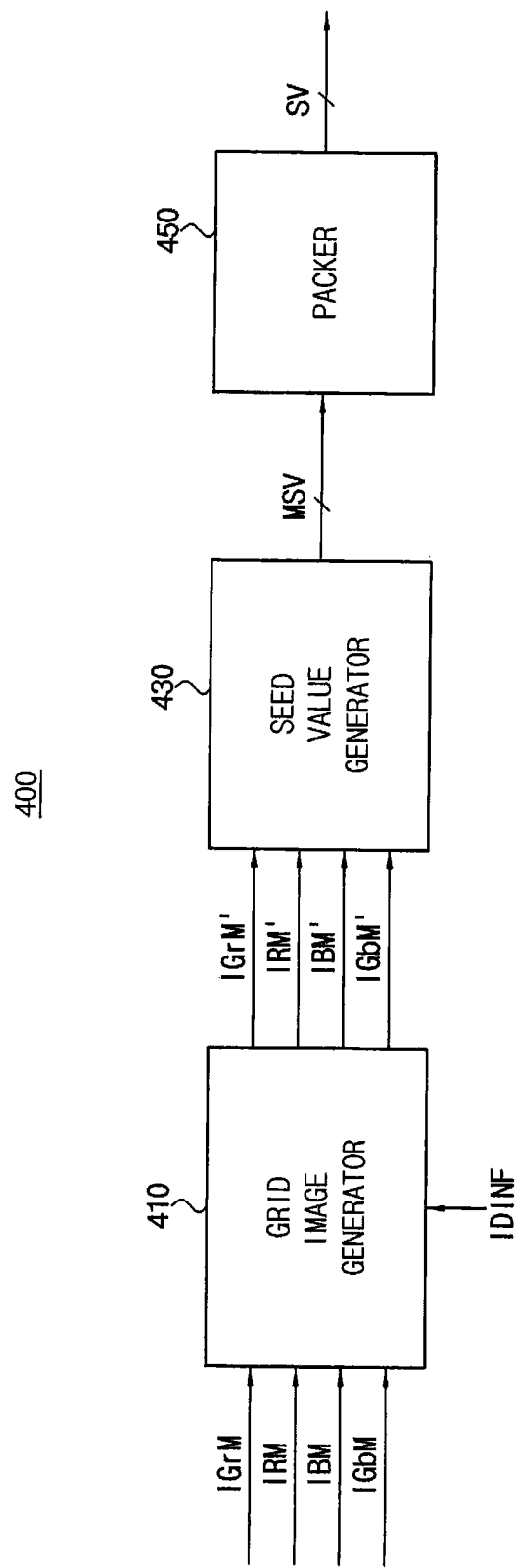
FIG. 11 is a block diagram illustrating the seed value calculation engine in the correction parameter generation unit of FIG. 7.

FIG. 11 is a block diagram illustrating the seed value calculation engine in the correction parameter generation unit of FIG. 7.

Referring to FIG. 11, the seed value calculation engine 400 may include a grid image generator 410, a seed value generator 430 and a bit packer 450.

The grid image generator 410 may receive the k representative channel image signals IGrM, IRM, IBM and IGbM, may sample r*r (where r is an integer equal to or greater than two) sub-pixels as one intersecting point, of each of the k representative channel image signals IGrM, IRM, IBM and IGbM based on the input information IDINF and may generate k grid image IGrM', IRM', IBM' and IGbM'. Therefore, a number of sub pixels in each of the k grid image IGrM', IRM', IBM' and IGbM' may be $1/r^2$ of each of the k representative channel image signals IGrM, IRM, IBM and IGbM.

The seed value generator 430 may perform a filtering on internal intersecting points of each of the k grid image signals IGrM', IRM', IBM' and IGbM' to generate intermediate seed values MSV for each of the k representative channel image signals IGrM, IRM, IBM and IGbM. The internal intersecting points of each of the k grid image signals IGrM', IRM', IBM' and IGbM' correspond to intersecting points except boundary intersecting points located in an outskirt region in each of the k grid image signals IGrM', IRM', IBM' and IGbM'. The filtering may be a median filtering and may be any other schemes to calculate intermediate values.

For example, when each of the k representative channel image signals IGrM, IRM, IBM and IGbM includes s*t sub-pixels (s=p/k, t=q/k), the grid image generator 410 may generate the k grid image signals IGrM', IRM', IBM' and IGbM' such that each unit grid of each of the k representative channel image signals IGrM, IRM, IBM and IGbM include u*u sub pixels. Because, an interval between two grid corresponds to u, each of the k grid image signals IGrM', IRM', IBM' and IGbM' may include F*G grids. F is a natural number equal to or greater than s/u and F is a natural number equal to or greater than t/u.

The seed value generator 430 may perform median filtering on pixel values of the internal intersecting points of each of the k grid image signals IGrM', IRM', IBM' and IGbM' to generate the intermediate seed values MSV for each of the k representative channel image signals IGrM, IRM, IBM and IGbM. When the seed value generator 430 may perform v*v (where v is an integer equal to or greater than two) median filtering, a number of the intermediate seed values MSV for one of the k representative channel image signals IGrM, IRM, IBM and IGbM corresponds to F*G, and a total number of the intermediate seed values MSV corresponds to 4*F*G.

When one intermediate seed value includes w (where w is an integer equal to or greater than two) bytes, the overall intermediate seed values MSV include w*F*G bytes. For reducing amount of bytes of the overall intermediate seed values MSV, the bit packer 450 stores bits of the intermediate seed values MSV, compresses the bits of the intermediate seed values MSV and provides the seed values SV which have smaller bites than the intermediate seed values MSV.

Figure 12:
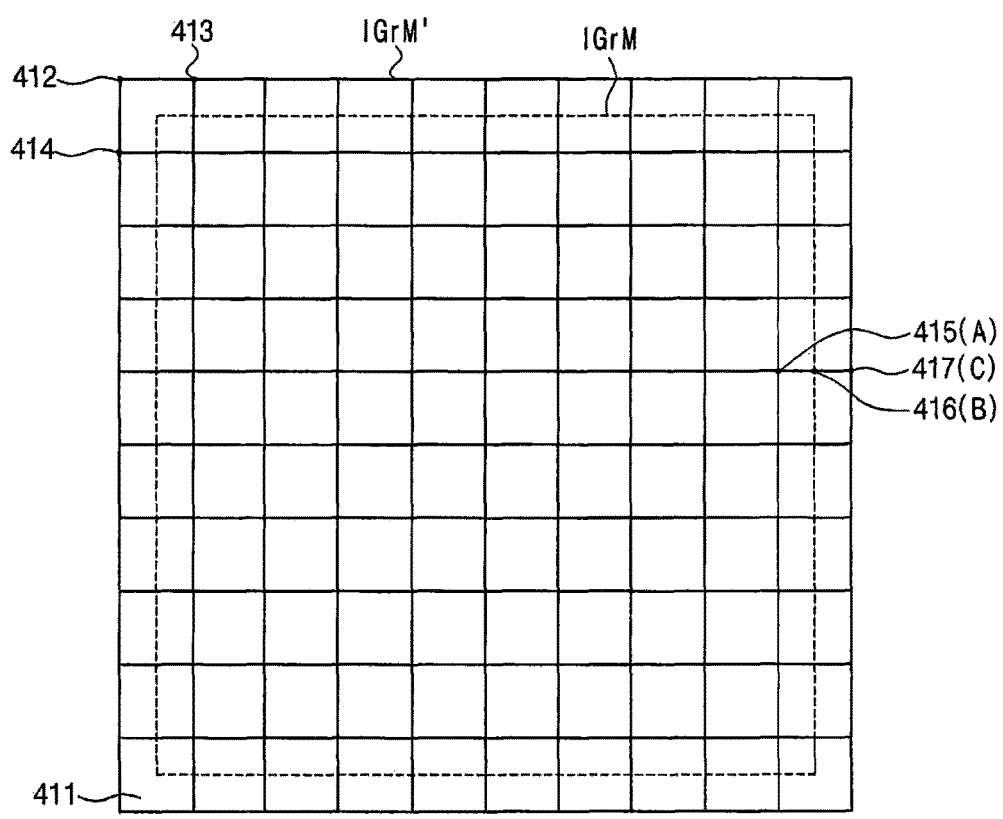
FIG. 12 is a diagram for explaining the image signal and the seed value in the seed value calculation engine in FIG. 11.

FIG. 12 is a diagram for explaining the image signal and the seed value in the seed value calculation engine in FIG. 11.

In FIG. 12, for convenience of explanation, there will be description on the grid image signal IGrM' for the representative channel image signal IGrM and the seed values SV using the grid image signal IGrM', and similar explanation may be applicable to other grid image signals IRM', IBM' and IGbM'.

Referring to FIG. 12, when it is assumed that the representative channel image signal IGrM includes s*t sub-pixels and one grid 411 includes u*u sub-pixels, the grid image signal IGrM' includes F*G intersecting points.

The seed value generator 430 performs a v*v median filtering on the internal intersecting points of the intersecting points in the grid image signal IGrM' and outputs a median value of $v^2$ pixel values as an intermediate seed value of a corresponding intersecting point. When the seed value generator 430 performs the median filtering, the seed value generator 430 may filter bad sub pixels of $v^2$ sub-pixels.

The seed value generator 430 may calculate an intermediate seed value of a corner intersecting point 412 of the boundary intersecting point by averaging intermediate seed values of intersecting points 413 and 414 adjacent to the corner intersecting point 412.

In addition, the seed value generator 430 may calculate intermediate seed values of rest boundary intersecting points 417 of boundary intersecting points except the corner intersecting points based on a pixel value of a sub-pixel 416 of the representative channel image signal IGrM, corresponding to the rest boundary intersecting point 417 and an intermediate seed value of an intersecting point 415 adjacent to the rest boundary intersecting point 417 in a first direction. For example, an intermediate seed value of the intersecting point 415 is A and a pixel value of the sub-pixel 416 is B, the intermediate seed value C of the rest boundary intersecting point 417 may be obtained by C=2*B−A. In this case, it is assumed that each interval of the intersecting point 415, the sub pixel 416 and the boundary intersecting point 417 is substantially identical.

As described with reference to FIGS. 11 and 12, because the seed values SV are calculated by sampling sub-pixels of each of the k representative channel image signals IGrM, IRM, IBM and IGbM, the crosstalk processing module 300 may reduce storing space of the storage 305 and a number of accesses to the storage 305.

Figure 13:
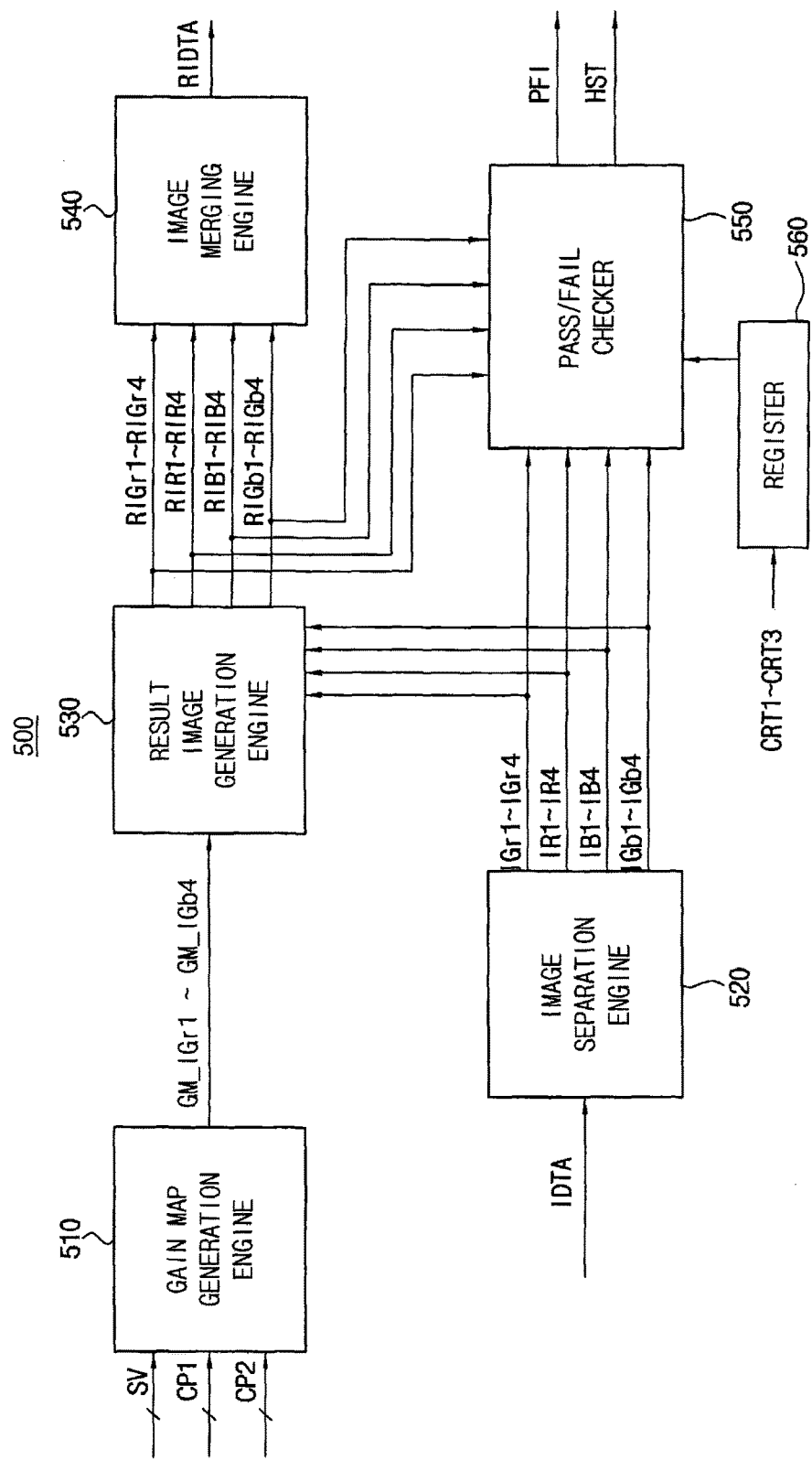
FIG. 13 is a block diagram illustrating the crosstalk correction check unit in the crosstalk processing module of FIG. 6 according to exemplary embodiments.

FIG. 13 is a block diagram illustrating the crosstalk correction check unit in the crosstalk processing module of FIG. 6 according to exemplary embodiments.

Referring to FIG. 13, the crosstalk correction check unit 500 may include a gain map generation engine 510, an image separation engine 520, a result image generation engine 530, an image merging engine 540, a pass/fail checker 550 and a register 560.

The image separation engine 520 may separate the image signal IDTA according to a channel of sub-pixels corresponding to each of the color filters in FIG. 2 to generate the 4*k channel image signals IGr1~IGr4, IR1~IR4, IB1~IB4 and IGb1~IGb4.

The gain map generation engine 510 may generate 4*k gain maps GM_IGr1~GM_IGb4 for correcting the crosstalk of each of the 4*k channel image signals IGr1~IGr4, IR1~IR4, IB1~IB4 and IGb1~IGb4 based on the seed values SV, the first correction parameters CP1 and the second correction parameters CP2.

The result image generation engine 530 may multiply sub-pixels of each of the 4*k channel image signals IGr1~IGr4, IR1~IR4, IB1~IB4 and IGb1~IGb4 by a gain of each sub-pixel of a corresponding gain main of the 4*k gain maps GM_IGr1~GM1~Gb4 to generate 4*k result channel image signals RIGr1~RIGr4, RIR1~RIR4, RIB1~RIB4 and RIGb1~RIGb4. The image merging engine 540 merge the 4*k result channel image signals RIGr1~RIGr4, RIR1~RIR4, RIB1~RIB4 and RIGb1~RIGb4 to output a final image signal RIDTA.

The pass/fail checker 550 may output the pass/fail information PFI and a histogram HST indicating a difference ratio between each of the 4*k channel image signals IGr1~IGr4, IR1~IR4, IB1~IB4 and IGb1~IGb4 and each of the 4*k result channel image signals RIGr1~RIGr4, RIR1~RIR4, RIB1~RIB4 and RIGb1~RIGb4 based on the 4*k channel image signals IGr1~IGr4, IR1~IR4, IB1~IB4 and IGb1~IGb4, the 4*k result channel image signals RIGr1~RIGr4, RIR1~RIR4, RIB1~RIB4 and RIGb1~RIGb4 and the reference values CRT1~CRT3. The register 560 may store the reference values CRT1~CRT3 and provide the reference values CRT1~CRT3 to the pass/fail checker 550.

The gain map generation engine 510 may perform interpolation on the seed values SV to generate k intermediate gain maps, and may apply the first correction parameters CP1 and the second correction parameters CP2 to the k intermediate gain maps to generate the 4*k gain maps GM_IG1~GM_IGb4. For example, the gain map generation engine 510 may perform bilinear interpolation on the seed values SV.

The pass/fail checker 550 may divide each of the 4*k channel image signals IGr1~IGr4, IR1~IR4, IB1~IB4 and IGb1~IGb4 and each of the 4*k result channel image signals RIGr1~RIGr4, RIR1~RIR4, RIB1~RIB4 and RIGb1~RIGb4 into a plurality of blocks and may count a first number of blocks for which the difference ratio is greater than a first reference value CRT1 with respect to corresponding blocks. The pass/fail checker 550 may determine whether the first number is greater than the second reference value CRT2 and may determine the correction of the crosstalk as a fail when at least one of difference ratios of the corresponding blocks is greater than the third reference value CRT3. In addition, the pass/fail checker 550 may determine the correction of the crosstalk as a fail when the first number is greater than the second reference value CRT2 for at least one channel.

Figure 14:
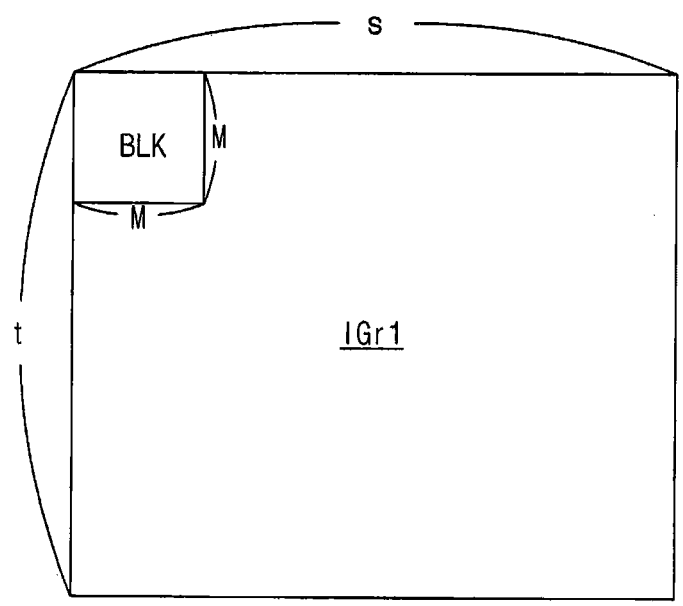
FIG. 14 illustrates that one channel image signal is divided into the plurality of blocks.

FIG. 14 illustrates that one channel image signal is divided into the plurality of blocks and FIG. 15 illustrates a histogram output from the pass/fail checker.

Referring to FIG. 14, when the channel image signal IGr1 includes s*t sub-pixels and one block BLK is set to include M*M sub-pixels, a number of blocks BLK J*K=w for covering the s*t sub-pixels. J is an integer equal to or greater than s/M and K is an integer equal to or greater than t/M.

Referring to FIG. 15, the histogram HST represents a difference ratio with respect to a plurality of ranges, of corresponding image signal pair of the 4*k channel image signals IGr1~IGr4, IR1~IR4, IB1~IB4 and IGb1=IGb4 and of the 4*k result channel image signals RIGr1~RIGr4, RIR1~RIR4, RIB1~RIB4 and RIGb1~RIGb4. The pass/fail checker 550 determines the pass or fail of the correction of the crosstalk by comparing the difference ratios with the reference values CRT1~CRT3 for each channel. The pass/fail checker 550 determines the pass or fail of the correction of the crosstalk of the result image signal RIDTA as a fail when the pass/fail checker 550 determines the pass or fail of the correction of the crosstalk for at least one channel.

Figure 16:
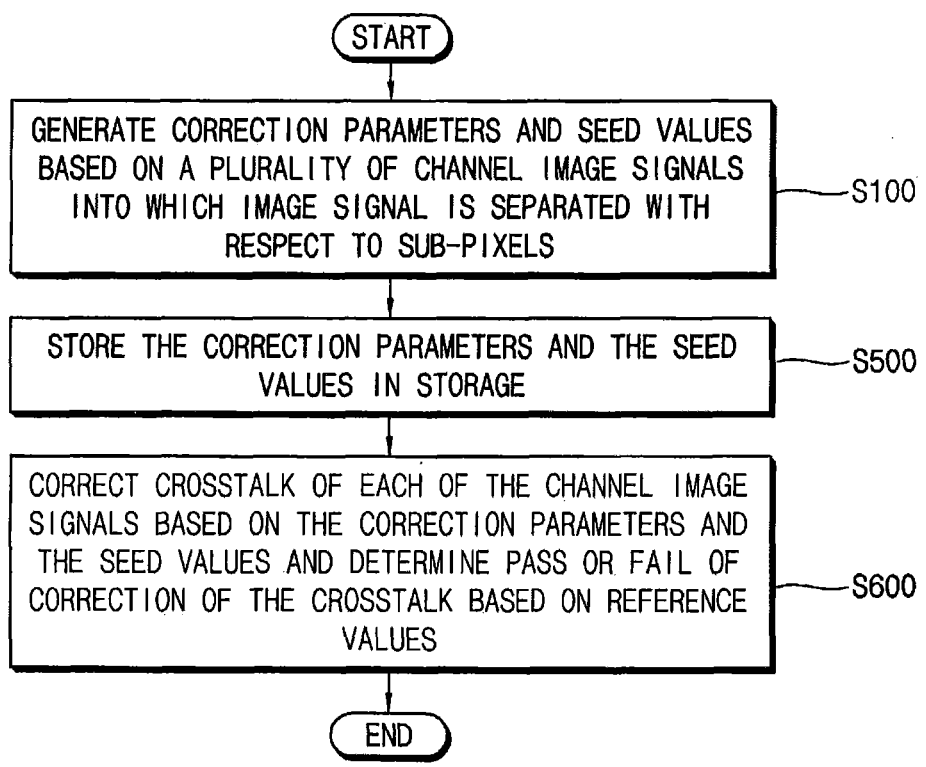
FIG. 16 is a flow chart illustrating a method of processing crosstalk of an image signal according to exemplary embodiments.

FIG. 16 is a flow chart illustrating a method of processing crosstalk of an image signal according to exemplary embodiments.

Referring to FIGS. 1 through 16, in a method of processing crosstalk of an image signal IDTA output from an image sensor 10 which includes a pixel array including a plurality of sub-pixels arranged along a plurality of rows and a plurality of columns, and k (k being an integer equal to or greater than four) adjacent sub-pixels of the plurality of sub-pixels represent one color, a correction parameter generation unit 310 generates seed values SV and correction parameters CP based on representative channel image signal which is used to correct the crosstalk, based on an image signal IDTA, input information IDINF which is associated with at least a size of the image signal IDTA and channel image signals. The image signal IDTA may be separated into the representative channel image signal according to color and the image signal IDTA may be separated into the channel image signals with respect to sub-pixel (S100). The seed values SV and correction parameters CP are stored in a storage 305 (S500).

The crosstalk correction check unit 500 corrects the crosstalk of each of the channel image signals based on the image signal IDTA, the seed values SV and the correction parameters CP and determines pass or fail of the correction of the crosstalk based on a plurality of reference values CRT1~CRT3 (S600).

Figure 17:
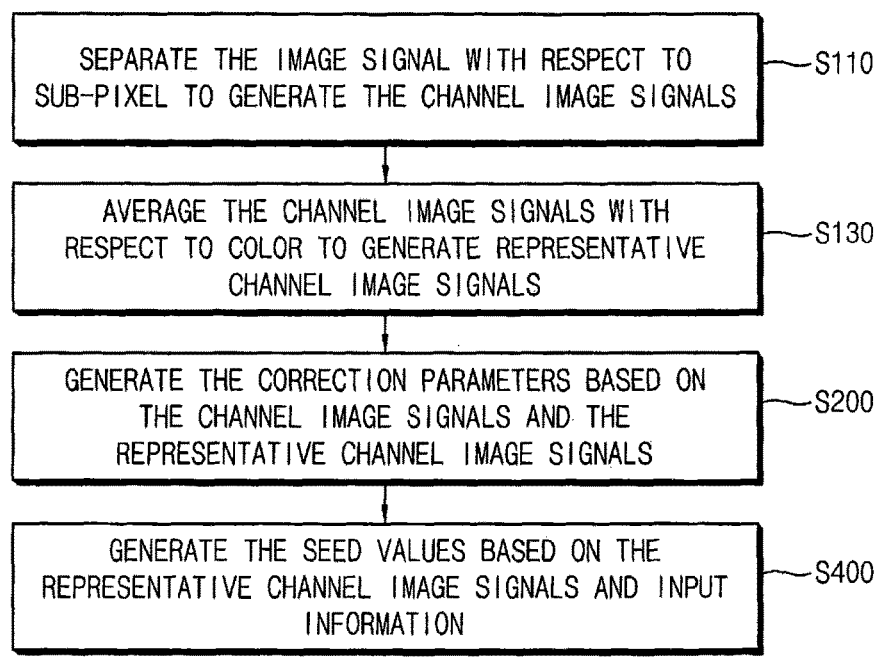
FIG. 17 is a flow chart illustrating an operation of generating seed values and correction parameters in FIG. 16.

FIG. 17 is a flow chart illustrating an operation of generating seed values and correction parameters in FIG. 16.

Referring to FIGS. 1 through 17, for generating the seed values SV and the correction parameters CP, an image separation engine 320 separate the image signal IDTA according to a channel of sub-pixels corresponding to each of the color filters to generate 4*k channel image signals IGr1~IGr4, IR1~IR4, IB1~IB4 and IGb1~IGb4 (S110), a representative channel image generation engine 330 averages pixel values with respect to each of the color filters, of each of the 4*k channel image signals IGr1~IGr4, IR1~IR4, IB1~IB4 and IGb1~IGb4 to generate k representative channel image signals IGrM, IRM, IBM and IGbM (S130), a correction parameter calculation engine 350 calculates correction parameters CP1 and CP2 based on the 4*k channel image signals IGr1~IGr4, IR1~IR4, IB1~IB4 and IGb1~IGb4 and the k representative channel image signals IGrM, IRM, IBM and IGbM (S200), and a seed value calculation engine 400 generates the seed values SV based on the k representative channel image signals IGrM, IRM, IBM and IGbM and the input information IDINF (S400).

Figure 18:
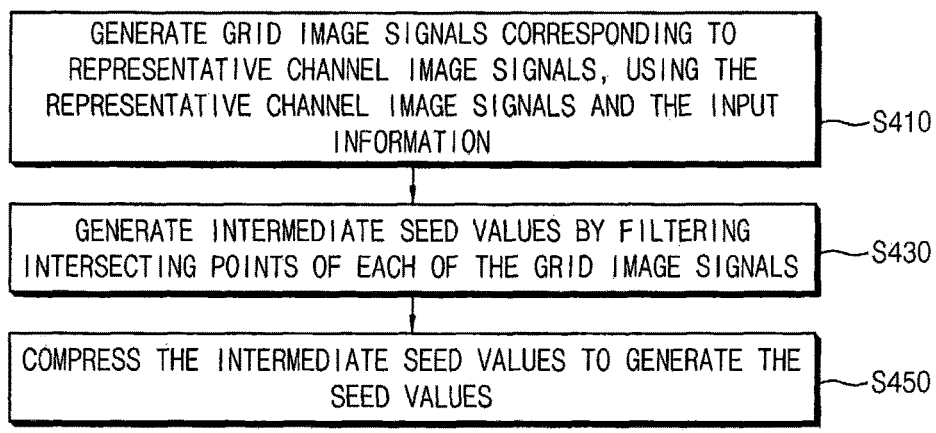
FIG. 18 is a flow chart illustrating an operation of generating seed values in FIG. 17 according to exemplary embodiments.

FIG. 18 is a flow chart illustrating an operation of generating seed values in FIG. 17 according to exemplary embodiments.

Referring to FIGS. 1 through 18, for generating the seed values SV (S400), a grid image generator 410 samples r*r (where r is an integer equal to or greater than two) sub-pixels as one intersecting point, of each of the k representative channel image signals IGrM, IRM, IBM and IGbM based on the input information IDINF (S410). The grid image generator 410 performs a median filtering on internal intersecting points of each of the k grid image signals IGrM', IRM', IBM' and IGbM' to generate intermediate seed values MSV for each of the k representative channel image signals IGrM, IRM, IBM and IGbM (S430). A bit packer 450 stores bits of the intermediate seed values MSV, compresses the bits of the intermediate seed values MSV and provides the seed values SV (S450).

Figure 19:
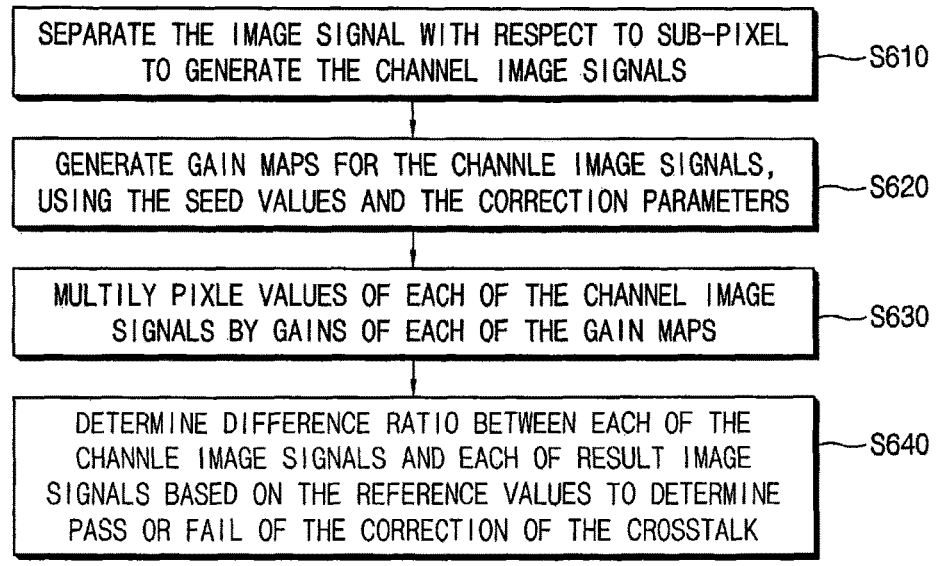
FIG. 19 is a flow chart illustrating an operation of determining a pass or fail of the correction of the crosstalk in FIG. 16.

FIG. 19 is a flow chart illustrating an operation of determining a pass or fail of the correction of the crosstalk in FIG. 16.

Referring to FIGS. 1 through 16 and 19, for determining a pass or fail of the correction of the crosstalk (S600), an image separation engine 520 separates the image signal IDTA according to a channel of sub-pixels corresponding to each of the color filters to generate the 4*k channel image signals IGr1~IGr4, IR1~IR4, IB1~IB4 and IGb1~IGb4 (S610). A gain map generation engine 510 generates 4*k gain maps GM_IGr1~GM_IGb4 for correcting the crosstalk of each of the 4*k channel image signals IGr1~IGr4, IR1~IR4, IB1~IB4 and IGb1~IGb4 based on the seed values SV, the first correction parameters CP1 and the second correction parameters CP2 (S620). A result image generation engine 530 multiplies sub-pixels of each of the 4*k channel image signals IGr1~IGr4, IR1~IR4, IB1~IB4 and IGb1~IGb4 by a gain of each sub-pixel of a corresponding gain main of the 4*k gain maps GM_IGr1~GM_IGb4 to generate 4*k result channel image signals RIGr1~RIGr4, RIR1~RIR4, RIB1~RIB4 and RIGb1~RIGb4 (S630). A pass/fail checker 550 calculates a difference ratio of corresponding image signal pair of the 4*k channel image signals IGr1~IGr4, IR1~IR4, IB1~IB4 and IGb1~IGb4 and of the 4*k result channel image signals RIGr1~RIGr4, RIR1~RIR4, RIB1~RIB4 and RIGb1~RIGb4 and determines the pass of fail of the correction of the crosstalk of each of the 4*k channel image signals IGr1~IGr4, IR1~IR4, IB1~IB4 and IGb1~IGb4 with respect to each channel based on the difference ratio and reference values CRT1~CRT3 (S640).

Figure 20:
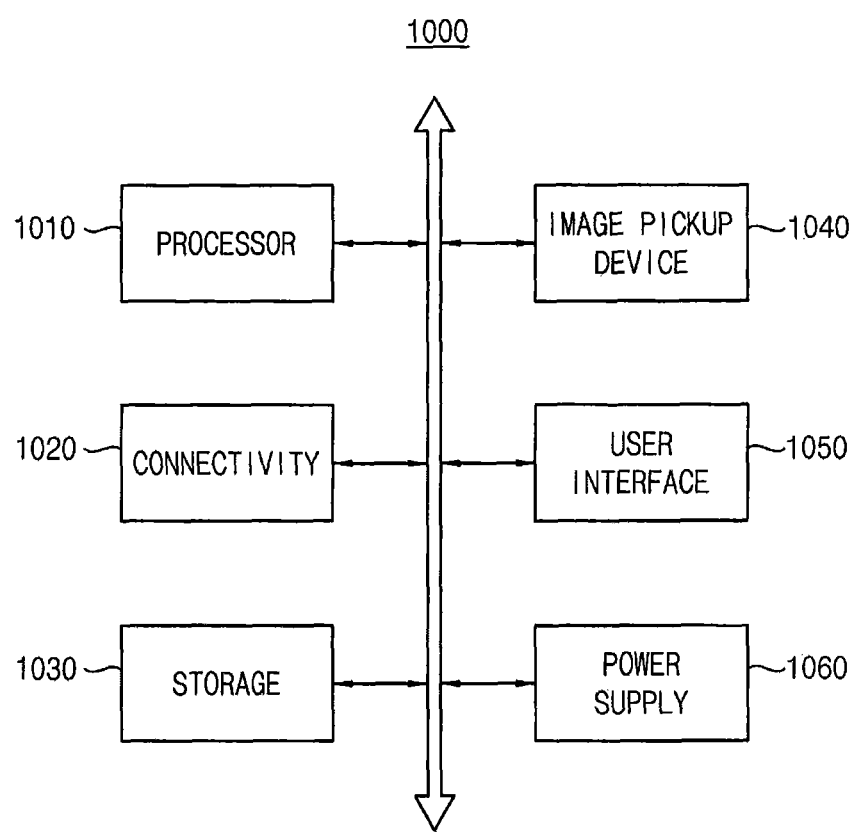
FIG. 20 is a block diagram illustrating an electronic system according to exemplary embodiments.

FIG. 20 is a block diagram illustrating an electronic system according to exemplary embodiments.

Referring to FIG. 20, an electronic system 1000 includes a processor 1010 and an image pickup device 1040. The electronic system 1000 may further include a connectivity module 1020, a storage device 1030, a user interface 1050 and a power supply 1060.

The processor 1010 controls overall operations of the electronic system 1000. The image pickup device 1040 is controlled by the processor 1010. The image pickup device 1040 may be the image processing system of FIG. 1. The image pickup device 1040 may include a pixel array including a plurality of sub-pixels arranged along a plurality of rows and a plurality of columns, k adjacent sub-pixels may represent one color, may correct crosstalk of each of 4*k channel image signals based on k representative channel image signals into which an image signal is separated according to color and may determines pass or fail of the correction of the crosstalk. Therefore, the image pickup device 1040 may reduce storing space of the storage device 1030 and a number of accesses to the storage 1030.

The connectivity module 1020 may communicate with an external device (not shown). The storage device 1030 may operate as a data storage for data processed by the processor 1010 or a working memory in the electronic system 1000.

The user interface 1050 may include at least one input device such as, for example, a keypad, a button, a touch screen, etc., and/or at least one output device such as, for example, a display device, etc. The power supply 1060 may provide power to the electronic system 1000.

The present disclosure may be applied to various image sensor and various imaging systems. For instance, the present disclosure may be applied to a mobile phone, a smart phone, a personal digital assistant (PDA), a portable multimedia player (PMP), a portable game console, a wearable system, an internet of things (IoT) system, 3D geometry reconstruction system, an array camera system, a virtual reality (VR) system, an augmented reality (AR) system, or the like.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A crosstalk processing module configured to process a crosstalk of an image signal produced from an image sensor, wherein the image sensor comprises a pixel array including a plurality of sub-pixels arranged along a plurality of rows and a plurality of columns, and k number of sub-pixels representing one color formed in conjunction with each other, and wherein the number k is an integer equal to or greater than four, the crosstalk processing module comprising:
   a correction element generation unit configured to receive the image signal and input information, the input information being associated with at least a size of the image signal, and configured to generate seed values and correction parameters which are used to correct the crosstalk;
   a storage, connected to the correction element generation unit, configured to store the seed values and the correction parameters;
   a crosstalk correction check unit configured to receive the image signal, receive the seed values and the correction parameters from the storage, correct the crosstalk produced from the image sensor, and output a final image signal and pass/fail information indicating a pass or fail of the correction of the crosstalk based on a plurality of reference values; and
   a control engine configured to control the correction element generation unit, the storage and the crosstalk correction check unit.

2. The crosstalk processing module of claim 1, wherein the plurality of sub-pixels includes a first color filter, a second color filter, a third color filter and a fourth color filter, each of the first second, third, and fourth color filter being formed with k number of sub-pixels, and
   wherein the correction element generation unit comprises:
      an image separation engine configured to separate the image signal into 4*k number of channel image signals with respect to each channel of sub-pixels corresponding to each of the color filters;

a representative channel image generation engine configured to calculate a representative value of pixel values of each of the 4*k number of channel image signals with respect to each of the color filters to generate k representative channel image signals;

a correction parameter calculation engine configured to calculate the correction parameters based on the 4*k channel image signals and the k representative channel image signals; and a seed value calculation engine configured to generate the seed values based on the k representative channel image signals and the input information.

3. The crosstalk processing module of claim 2, wherein: the image signal has a first size defined by p sub-pixels along a first direction and q sub-pixels along a second direction perpendicular to the first direction, where p and q are multiples of four and are greater than four; and each of the channel image signals and each of the representative channel image signals have a second size defined by p/k sub-pixels along the first direction and q/k sub-pixels along the second direction.

4. The crosstalk processing module of claim 2, wherein the correction parameter calculation engine comprises:

a first correction parameter calculator configured to calculate a ratio of a sum of pixel values of each of the k representative channel image signals to a sum of pixel values of each of the 4*k channel image signals with respect to each channel to calculate 4*k first correction parameters, based on the k representative channel image signals and the 4*k number of channel image signals; and a second correction parameter calculator to calculate 4*k pairs of second correction parameters, each pair including a first shift along a first direction and a second shift along a second direction based on the k representative channel image signals and the 4*k channel image signals, wherein the second direction is perpendicular to the first direction, wherein the first shift is associated with a shift between each of the k representative channel image signals and each of k image signals of a same color channel in the first direction, wherein the second shift is associated with a shift between each of the k representative channel image signals and each of the k image signals of the same color channel in the second direction, and wherein the k image signals of the same color channel is associated with image signals corresponding to the same color filter.

5. The crosstalk processing module of claim 4, wherein the second correction parameter calculator is configured to calculate the 4*k pairs of the second correction parameters based on absolute value of a first number of pixel values in the second direction and absolute value of a second number of pixel values in the first direction, of each of the k representative channel image signals and of each of the k image signals of the same color channel.

6. The crosstalk processing module of claim 2, wherein in the seed value calculation engine comprises:

a grid image generator configured to sample r*r sub-pixels as one intersecting point of each of the k representative channel image signals to generate k grid image signals, based on the input information, where r is an integer equal to or greater than two;

a seed value generator configured to perform a filtering on internal intersecting points of each of the k grid image signals to generate intermediate seed values for each of the k representative channel image signals, wherein the internal intersecting points of each of the k grid image signals correspond to intersecting points except boundary intersecting points located in an outskirt region in each of the k grid image signals; and a packer configured to store bits of the intermediate seed values to provide the seed values by compressing the bits.

7. The crosstalk processing module of claim 6, wherein the seed value generator is configured to generate a corresponding intermediate seed value based on pixel values of adjacent two intersecting points for each corner intersecting point of the boundary intersecting points.

8. The crosstalk processing module of claim 7, wherein the seed value generator is configured to generate a corresponding intermediate seed value for each rest intersecting points except the corner intersecting points of the boundary intersecting points based on a pixel value of the representative channel image signal, corresponding to each of the rest intersecting points and a pixel value of an intersecting point adjacent to each of the rest intersecting points in a first direction.

9. The crosstalk processing module of claim 6, wherein the seed value generator is configured to perform median filtering on each of the intersecting points to generate the intermediate seed values.

10. The crosstalk processing module of claim 1, wherein the correction parameters comprise first correction parameters and second correction parameters, wherein the plurality of sub-pixels includes a first color filter, a second color filter, a third color filter and a fourth color filter with respect to the k number of sub-pixels, and wherein the crosstalk correction check unit comprises:

a gain map generation engine configured to generate 4*k gain maps based on the seed values, the first correction parameters and the second correction parameters;

an image separation engine configured to separate the image signal according to a channel of sub-pixels corresponding to each of the color filters to generate 4*k channel image signals;

a result image generation engine configured to multiply sub-pixels of each of the 4*k channel image signals by a gain of each sub-pixel of a corresponding gain main of the 4*k gain maps to generate 4*k result channel image signals;

an image merging engine configured to merge the 4*k result channel image signals to output the final image signal; and a pass/fail checker configured to output the pass/fail information and a histogram indicating a difference ratio between corresponding image signal pair of each of the 4*k channel image signals and each of the 4*k result channel image signals based on the 4*k channel image signals, the 4*k result channel image signals and the reference values.

11. The crosstalk processing module of claim 10, wherein the gain map generation engine is configured to generate k intermediate gain maps by performing interpolation on the seed values and to generate the 4*k gain maps by applying the first correction parameters and the second correction parameters to the k intermediate gain maps.

12. The crosstalk processing module of claim 10, wherein the pass/fail checker is configured to:

divide each of the 4*k channel image signals and each of the 4*k result channel image signals into a plurality of blocks; and count a first number of blocks, each of which of the difference ratio is greater than a first reference value of the reference values, with respect to corresponding blocks.

13. The crosstalk processing module of claim 12, wherein the pass/fail checker is further configured to:
determine whether the first number is greater than a second reference value of the reference values; and
determine the correction of the crosstalk as a fail when at least one of difference ratios of the blocks is greater than a third reference value of the reference values.

14. The crosstalk processing module of claim 13, wherein the pass/fail checker is configured to determine the correction of the crosstalk as a fail when the first number is greater than the second reference value with respect to at least one channel.

15. A method of processing a crosstalk of an image signal produced from an image sensor, wherein the image sensor comprises a pixel array including a plurality of sub-pixels arranged along a plurality of rows and a plurality of columns, and k number of sub-pixels representing one color formed in conjunction with each other, where the number k is an integer equal to or greater than four, the method comprising:
generating seed values and correction parameters which are used to correct the crosstalk based on the image signal, input information associated with at least a size of the image signal, a representative channel image signal obtained by separating the image signal per color and channel image signals obtained by separating the image signal per channel;
storing the seed values and the correction parameters in a storage; and
correcting the crosstalk of each of the channel image signals based on the image signal, the seed values, and the correction parameter, and determining a pass or fail of the correction of the crosstalk based on a plurality of reference values, wherein the seed values are generated based on the representative channel image signal.

16. The method of claim 15, wherein each of the k number of sub-pixels includes a first color filter, a second color filter, a third color filter and a fourth color filter, and
wherein generating the seed values and the correction parameters comprises:
separating the image signal according to a channel of sub-pixels corresponding to each of the color filters to generate 4*k channel image signals;
calculating a representative value of pixel values with respect to each of the color filters, of pixel values of each of the 4*k channel image signals to generate k representative channel image signals;
calculating the correction parameters based on the 4*k channel image signals and the k representative channel image signals; and
generating the seed values based on the k representative channel image signals and the input information.

17. The method of claim 16, wherein generating the seed values comprises:
sampling r*r sub-pixels as one intersecting point of each of the k representative channel image signals to generate k grid image signals, based on the input information, wherein r is an integer equal to or greater than two;
performing a filtering on internal intersecting points of each of the k grid image signals to generate intermediate seed values for each of the k representative channel image signals, wherein the internal intersecting points of each of the k grid image signals correspond to intersecting points except boundary intersecting points located in an outskirt region in each of the k grid image signals; and
storing bits of the intermediate seed values to provide the seed values by compressing the bits.

18. The method of claim 15, wherein the correction parameters comprise first correction parameters and second correction parameters, wherein the plurality of sub-pixels includes a first color filter, a second color filter, a third color filter and a fourth color filter per the k number of sub-pixels, and
wherein determining a pass or fail of the correction of the crosstalk comprises:
separating the image signal according to a channel of sub-pixels corresponding to each of the color filters to generate 4*k channel image signals;
generating 4*k gain maps based on the seed values, the first correction parameters and the second correction parameters;
multiplying sub-pixels of each of the 4*k channel image signals by a gain per sub-pixel of a corresponding gain main of the 4*k gain maps to generate 4*k result channel image signals; and
outputting pass/fail information and a histogram indicating a difference ratio between each of the 4*k channel image signals and each of the 4*k result channel image signals based on the 4*k channel image signals, the 4*k result channel image signals and the reference values.

19. An image processing system comprising:
an image sensor including a pixel array that includes a plurality of sub-pixels arranged along a plurality of rows and a plurality of columns, and k number of sub-pixels representing one color formed in conjunction with each other, wherein the number k is an integer equal to or greater than four, the image sensor configured to output an image signal; and
a crosstalk processing module configured to process a crosstalk of the image signal from the image sensor, wherein the crosstalk processing module comprises:
a correction element generation unit configured to receive the image signal and input information, the input information being associated with at least a size of the image signal, and to generate seed values and correction parameters which are used to correct the crosstalk based on the input information and a representative channel image signal obtained by separating the image signal per color;
a storage connected to the correction element generation unit, the storage configured to store the seed values and the correction parameters;
a crosstalk correction check unit configured to receive the image signal, the seed values, and the correction parameters from the storage for correcting the crosstalk, and to output a final image signal and pass/fail information indicating a pass or fail of the correction of the crosstalk based on a plurality of reference values; and
a control engine configured to control the correction element generation unit, the storage and the crosstalk correction check unit.

20. The image processing system of claim 19, wherein the image sensor includes a complementary metal-oxide semiconductor (CMOS) image sensor.

* * * * *